(12) United States Patent
Cha et al.

(10) Patent No.: US 11,903,278 B2
(45) Date of Patent: Feb. 13, 2024

(54) DISPLAY PANEL INCLUDING AN INITIALIZATION VOLTAGE LINE AND AN AUXILIARY VOLTAGE LINE AND DISPLAY DEVICE INCLUDING THE SAME

(71) Applicant: Samsung Display Co., Ltd., Yongin-si (KR)

(72) Inventors: Hyunji Cha, Yongin-si (KR); Jihyun Ka, Yongin-si (KR); Sukyoung Kim, Yongin-si (KR); Hwayoung Song, Yongin-si (KR); Youngsoo Yoon, Yongin-si (KR); Dongeup Lee, Yongin-si (KR); Wonse Lee, Yongin-si (KR); Yunkyeong In, Yongin-si (KR); Donghyeon Jang, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 17/676,071

(22) Filed: Feb. 18, 2022

(65) Prior Publication Data
US 2022/0173205 A1    Jun. 2, 2022

Related U.S. Application Data

(63) Continuation of application No. 16/887,760, filed on May 29, 2020, now Pat. No. 11,257,897.

(30) Foreign Application Priority Data

Aug. 26, 2019   (KR) .................. 10-2019-0104580

(51) Int. Cl.
  *H01L 29/12*    (2006.01)
  *H10K 59/131*   (2023.01)
  *H10K 59/121*   (2023.01)

(52) U.S. Cl.
  CPC ....... *H10K 59/131* (2023.02); *H10K 59/1213* (2023.02); *H10K 59/1216* (2023.02)

(58) Field of Classification Search
  CPC ............. H10K 59/1213; H10K 59/131; H10K 59/1216
  (Continued)

(56) References Cited

U.S. PATENT DOCUMENTS 10,466,822 B2    11/2019  Kim et al.
11,257,897 B2 *   2/2022  Cha ...................... H10K 59/131
                          (Continued)

FOREIGN PATENT DOCUMENTS

KR    10-2014-0018623 A    2/2014
KR    10-2016-0052943 A    5/2016
(Continued)

*Primary Examiner* — Phuc T Dang
(74) *Attorney, Agent, or Firm* — Lewis Roca Rothgerber Christie LLP

(57) ABSTRACT

A display panel includes: a substrate including a first area and a second area surrounding the first area; a first initialization voltage line extending in a first direction and electrically connected to the first display element; a second initialization voltage line extending in the first direction and electrically connected to the second display element; an auxiliary voltage line arranged on a layer different from layers on which the first initialization voltage line and the second initialization voltage line are arranged and electrically connecting the first initialization voltage line and the second initialization voltage line that are apart from each other; and a first insulating layer covering the first initialization voltage line, the second initialization voltage line, and the auxiliary voltage line and arranged below the plurality of display elements.

15 Claims, 24 Drawing Sheets

(58) Field of Classification Search
USPC .......................................................... 257/71
See application file for complete search history.

(56) References Cited

U.S. PATENT DOCUMENTS

| | | |
|---|---|---|
| 2014/0184579 A1 | 7/2014 | Kim et al. |
| 2016/0020432 A1 | 1/2016 | Yu |
| 2016/0125809 A1 | 5/2016 | Hwang |
| 2016/0343786 A1 | 11/2016 | Zhang et al. |
| 2017/0040406 A1* | 2/2017 | Park .................... H10K 77/111 |
| 2018/0145125 A1* | 5/2018 | Lee .................... H10K 59/1213 |
| 2018/0158895 A1 | 6/2018 | Lee et al. |
| 2019/0081090 A1* | 3/2019 | Lee .................... H01L 27/1218 |
| 2019/0122608 A1 | 4/2019 | Kang et al. |
| 2019/0157376 A1 | 5/2019 | Kim et al. |
| 2020/0044006 A1 | 2/2020 | Lee et al. |

FOREIGN PATENT DOCUMENTS

| | | |
|---|---|---|
| KR | 10-2017-0065059 A | 6/2017 |
| KR | 10-2018-0063633 A | 6/2018 |
| KR | 10-2020-0015868 A | 2/2020 |

* cited by examiner

DISPLAY PANEL INCLUDING AN INITIALIZATION VOLTAGE LINE AND AN AUXILIARY VOLTAGE LINE AND DISPLAY DEVICE INCLUDING THE SAME

CROSS-REFERENCE TO RELATED APPLICATIONS

This application is a continuation of U.S. patent application Ser. No. 16/887,760, filed May 29, 2020, which claims priority to and the benefit of Korean Patent Application No. 10-2019-0104580, filed Aug. 26, 2019, the entire content of both of which is incorporated herein by reference.

BACKGROUND

1. Field

Aspects of one or more example embodiments relate to a display panel and a display device including the same.

2. Description of Related Art

Recently, the uses of display devices have become more diversified. As display devices have become thinner and more lightweight, their range of use has gradually expanded.

As display devices are used in various ways, their shapes may be designed in various ways. Also, functions that may be combined or associated with display devices are increasing.

The above information disclosed in this Background section is only for enhancement of understanding of the background and therefore the information discussed in this Background section does not necessarily constitute prior art.

SUMMARY

As a way of increasing functions that may be combined or associated with a display device, one or more example embodiments include a display device including a component area in which a camera, a sensor, etc. may be arranged inside a display area.

Additional aspects will be set forth in part in the description which follows and, in part, will be more apparent from the description, or may be learned by practice of the presented example embodiments of the disclosure.

According to one or more example embodiments, a display panel includes: a substrate including a first area and a second area surrounding the first area a plurality of display elements arranged in the second area and including a first display element and a second display element that are apart from each other with the first area therebetween, a first initialization voltage line extending in a first direction and electrically connected to the first display element, a second initialization voltage line extending in the first direction and electrically connected to the second display element, an auxiliary voltage line arranged on a layer different from layers on which the first initialization voltage line and the second initialization voltage line are arranged and electrically connecting the first initialization voltage line and the second initialization voltage line that are apart from each other, and a first insulating layer covering the first initialization voltage line, the second initialization voltage line, and the auxiliary voltage line and arranged below the plurality of display elements.

According to some example embodiments, each of the plurality of display elements may include a pixel electrode, an opposite electrode above the pixel electrode, and an emission layer between the pixel electrode and the opposite electrode, and the auxiliary voltage line may be arranged below the pixel electrode with the first insulating layer therebetween.

According to some example embodiments, the display panel may further include a second insulating layer arranged between the first and second initialization voltage lines and the auxiliary voltage line.

According to some example embodiments, the display panel may further include thin film transistors and a storage capacitor, the thin film transistors and the storage capacitor being electrically connected to the first display element, wherein the first initialization voltage line and the second initialization voltage line may include the same material as that of one of electrodes of the storage capacitor.

According to some example embodiments, the storage capacitor may include a bottom electrode and a top electrode, and the first initialization voltage line and the second initialization voltage line may include the same material as that of the top electrode.

According to some example embodiments, the display panel may further include a contact metal connecting one of the thin film transistors to the first display element, wherein the auxiliary voltage line may include the same material as that of the contact metal.

According to some example embodiments, the display panel may further include a mediation metal layer arranged between the first initialization voltage line and the auxiliary voltage line, and between the second initialization voltage line and the auxiliary voltage line.

According to some example embodiments, the display panel may further include a first scan line extending in the first direction and electrically connected to the first display element, and a second scan line extending in the first direction and electrically connected to the second display element, wherein the first scan line may be apart from the second scan line with the first area therebetween.

According to some example embodiments, the display panel may further include a first emission control line extending in the first direction and electrically connected to the first display element, and a second emission control line extending in the first direction and electrically connected to the second display element, wherein the first emission control line may be apart from the second emission control line with the first area therebetween.

According to some example embodiments, the display panel may further include an initialization power supply line arranged in an outer area of the substrate, wherein the initialization power supply line may be arranged between the substrate and the first insulating layer.

According to some example embodiments, the display panel may further include a first data line extending in a second direction intersecting the first direction and connected to the first display element, and a second data line extending in the second direction and connected to the second display element, wherein the initialization power supply line may include the same material as that of the first data line or the second data line.

According to one or more embodiments, a display device including at least one component area arranged inside a display area, and a non-display area surrounding the display area, includes a plurality of display elements constituting the display area, each of the plurality of display elements including a pixel electrode, an emission layer, and an opposite electrode that are sequentially stacked, a first initialization voltage line electrically connected to a first display element among the plurality of display elements and extending in a first direction in the display area, a second initialization voltage line electrically connected to a second display element among the plurality of display elements, extending in the first direction in the display area, and apart from the first initialization voltage line with the at least one component area therebetween, an auxiliary voltage line electrically connecting the first initialization voltage line to the second initialization voltage line, and a first insulating layer arranged between the auxiliary voltage line and the pixel electrode.

According to some example embodiments, the display device may further include a second insulating layer arranged between the first and second initialization lines and the auxiliary voltage line.

According to some example embodiments, the display device may further include thin film transistors and a storage capacitor, the thin film transistors being electrically connected to the first display element, and the storage capacitor including a bottom electrode and a top electrode, wherein the first initialization voltage line and the second initialization voltage line may include the same material as that of the top electrode of the storage capacitor.

According to some example embodiments, the display device may further include a contact metal connecting one of the thin film transistors to the first display element, wherein the auxiliary voltage line may include the same material as that of the contact metal.

According to some example embodiments, the first initialization voltage line and the second initialization voltage line may be arranged on the same layer.

According to some example embodiments, the display device may further include a mediation metal layer arranged between the first initialization voltage line and the auxiliary voltage line, and between the second initialization voltage line and the auxiliary voltage line.

According to some example embodiments, the display device may further include a first scan line extending in the first direction and electrically connected to the first display element, and a second scan line extending in the first direction and electrically connected to the second display element, wherein the first scan line may be apart from the second scan line with the at least one component area therebetween.

According to some example embodiments, the display device may further include a first emission control line extending in the first direction and electrically connected to the first display element, and a second emission control line extending in the first direction and electrically connected to the second display element, wherein the first emission control line may be apart from the second emission control line with the at least one component area therebetween.

According to some example embodiments, the display device may further include an initialization power supply line arranged in the non-display area.

According to some example embodiments, the initialization power supply line may be arranged below the first insulating layer.

According to some example embodiments, the display device may further include a first data line extending in a second direction intersecting the first direction and connected to the first display element, and a second data line extending in the second direction and connected to the second display element, wherein the initialization power supply line may include the same material as that of the first data line or the second data line.

According to some example embodiments, the at least one component area may include a first component area and a second component area arranged in the first direction.

According to some example embodiments, the first initialization voltage line may be located on one side of the first component area, and the second initialization voltage line may be located on one side of the second component area, and the first component area and the second component area may be located between the first initialization voltage line and the second initialization voltage line that are apart from each other.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
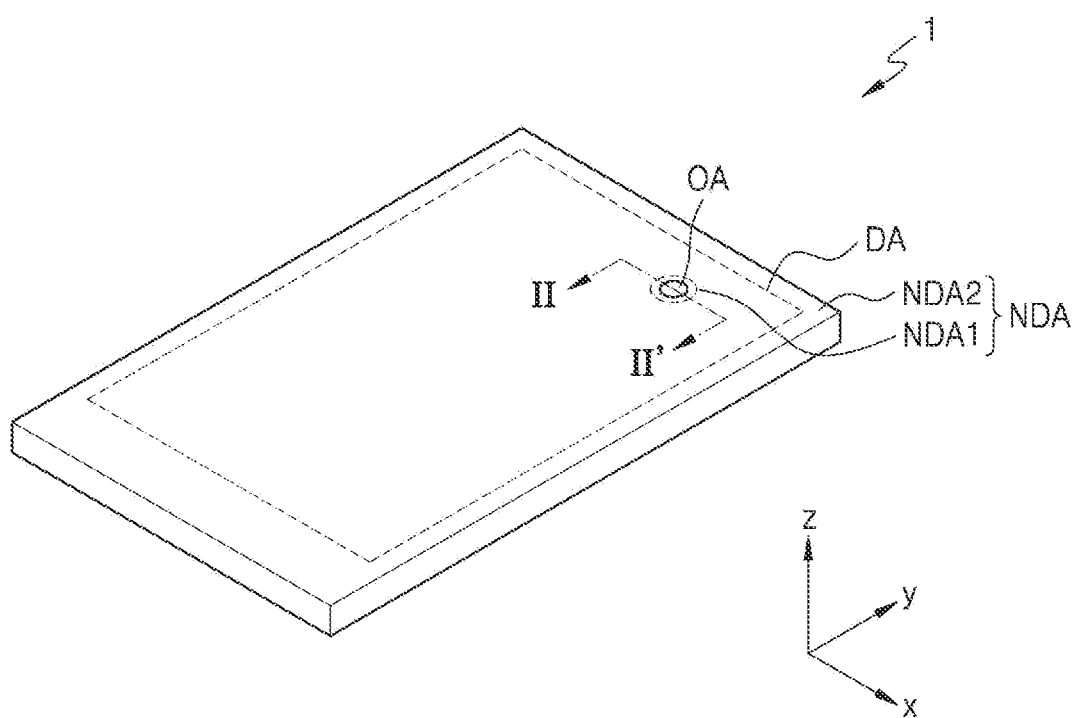
FIG. 1 is a perspective view of a display device according to some example embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, aspects of some example embodiment of the present invention are described in more detail with reference to the accompanying drawings. In the drawings, the same reference numerals are given to the same or corresponding elements, and repeated description thereof is omitted.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it can be directly or indirectly formed on the other layer, region, or element. That is, for example, intervening layers, regions, or elements may be present.

Sizes of elements in the drawings may be exaggerated for convenience of explanation. In other words, because sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

It will be understood that when a layer, region, or element is referred to as being "connected" to another layer, region, or element, it may be "directly connected" to the other layer, region, or element and/or may be "indirectly connected" to the other layer, region, or element with other layer, region, or element interposed therebetween. For example, it will be understood that when a layer, region, or element is referred to as being "electrically connected" to another layer, region, or element, it may be "directly electrically connected" to the other layer, region, or element and/or may be "indirectly electrically connected" to other layer, region, or element with other layer, region, or element interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display device 1 according to some example embodiments.

Referring to FIG. 1, the display device 1 may include a display area DA that emits light and a non-display area NDA that does not emit light. The display device 1 may display an image by using light emitted from a plurality of pixels arranged in the display area DA.

The display device 1 may include a component area OA, for example, located within, or at least partially within the display area DA. That is, the component area OA may be at least partially surrounded by the display area DA. For example, as shown in FIG. 1, according to some example embodiments, the component area OA may be entirely surrounded by the display area DA.

The non-display area NDA may include a first non-display area NDA1 and a second non-display area NDA2, the first non-display area NDA1 surrounding the component area OA, and the second non-display area NDA2 surrounding the outside of the display area DA. For example, the first non-display area NDA1 may entirely surround the component area OA, the display area DA may entirely surround the first non-display area NDA1, and the second non-display area NDA2 may entirely surround the display area DA.

Thus, according to some example embodiments, the display device 1 may include a component area OA located within, or surrounded by, a first non-display area NDA1, and the first non-display area NDA1 and the component area OA may both be located within the display area DA. Embodiments of the present invention, however, are not limited to the component area OA being located entirely within the display area DA. For example, according to some example embodiments, the component area OA may extend outside a border or edge of the display area. Additionally, according to some example embodiments, the first non-display area NDA1 or the second non-display area NDA2 may be omitted, or the first non-display area NDA1 and the second non-display area NDA2 may be connected to or merged with each other.

As described below with reference to FIG. 2A, the component area OA may be a location in which a component is arranged. The component area OA may be a transmission area through which light and/or sound output from a component to the outside or progressing from the outside toward the component may pass. According to some example embodiments, in the case where light passes through the component area OA, a light transmittance may be 50% or more, or, according to some example embodiments, 70% or more, 75% or more, 80% or more, or 85% or more, or 90% or more.

Hereinafter, although the display device 1 is described in the context of an organic light-emitting display device as an example, a display device according to embodiments of the present disclosure is not limited thereto. According to some example embodiments, the display device 1 may be various ones, for example, an inorganic light-emitting display and a quantum dot light-emitting display. For example, an emission layer of a display element provided to the display device 1 may include an organic material, an inorganic material, quantum dots, an organic material and quantum dots, or an inorganic material and quantum dots.

Though it is shown in FIG. 1 that the component area OA is arranged on one side (an upper right side) of the display area DA, the embodiments according to the present disclosure are not limited thereto. For example, a shape of the display area DA may be a circle, an ellipse, or a polygon such as a triangle, or a pentagon, or any other suitable shape according to the design of the display device 1 (and/or the location of the component area OA). A location of the component area OA may be variously changed. For example, the component area OA may be arranged in an upper central portion of a plane (e.g., an x-y plane) of the display area DA.

FIGS. 2A to 2D are cross-sectional views of the display device 1 according to embodiments. For example, FIGS. 2A to 2D may correspond to a cross-section taken along the line II-II' of FIG. 1.

Figure 2A:
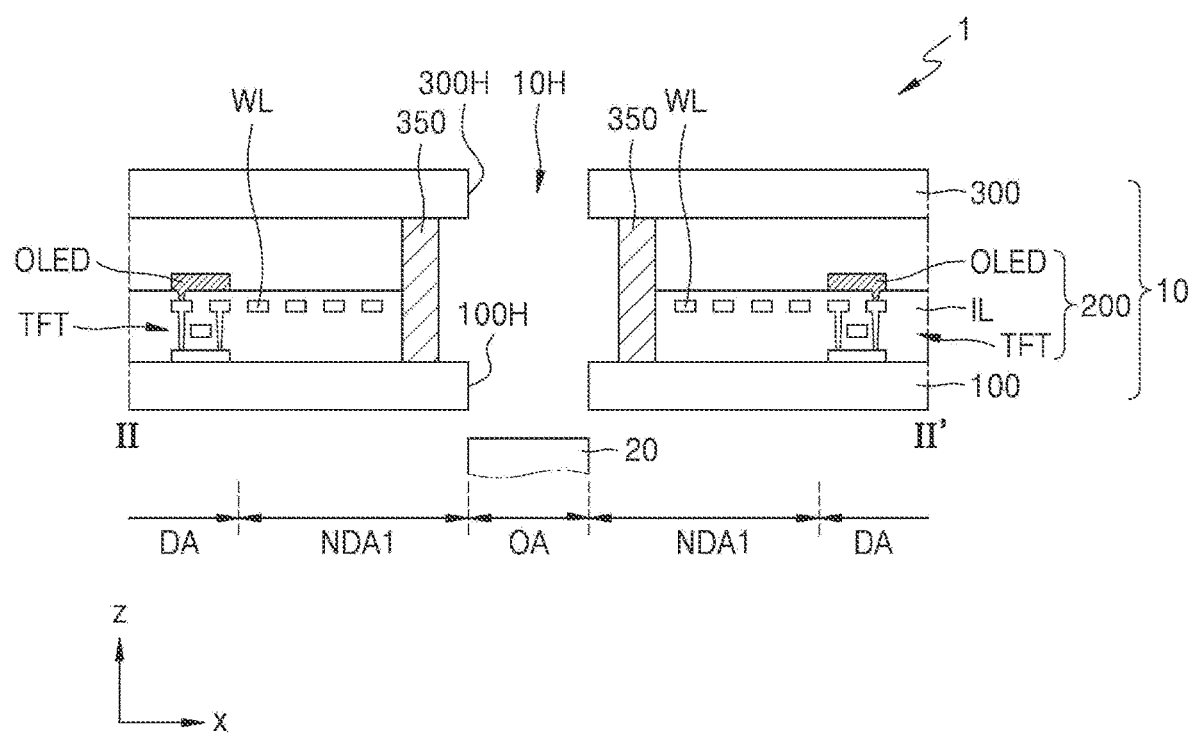
FIGS. 2A to 2D are cross-sectional views of a display device according to some example embodiments.

Referring to FIG. 2A, the display device 1 may include a display panel 10 and a component 20, the display panel 10 including a display element, and the component 20 corresponding to the component area OA.

The display panel 10 may include a substrate 100, an encapsulation substrate 300, and a display layer 200 therebetween, the encapsulation substrate 300 serving as an encapsulation member facing the substrate 100. A sealing material 350 (sealant) covering lateral sides of the display layer 200 may be arranged between the substrate 100 and the encapsulation substrate 300. Though it is shown in FIG. 2A that the sealing material 350 is arranged on two opposite sides of the component area OA, the component area OA may be entirely surrounded by the sealing material 350 when viewed in a direction perpendicular to a main surface of the substrate 100 (e.g., when viewed from a plan view or a direction normal to the planar surface of the display panel 10).

The substrate 100 may include glass or a polymer resin. The polymer resin may include any suitable polymer resin material, for example, polyethersulfone (PES), polyarylate, polyetherimide (PEI), polyacrylate, polyethylene naphthalate (PEN), polyethylene terephthalate (PET), polyphenylene sulfide (PPS), polyarylate, polyimide (PI), polycarbonate (PC), cellulose tri acetate (TAC), and cellulose acetate propionate (CAP). The substrate 100 including the polymer resin may be flexible, rollable, or bendable. The substrate 100 may have a multi-layered structure including a layer including the above polymer resin and an inorganic layer. The encapsulation substrate 300 may include any suitable encapsulation substrate material, for example, glass or the polymer resin.

The display layer 200 may include a circuit layer, an organic light-emitting diode OLED, and an insulating layer therebetween, the circuit layer including a thin film transistor TFT, and the organic light-emitting diode OLED serving as a display element connected to the thin film transistor TFT. The thin film transistor TFT and the organic light-emitting diode OLED connected thereto may be arranged in the display area DA. Some of wiring lines WL of the display layer 200 may be located in the first non-display area NDA1. The wiring lines WL may provide a signal or voltage (e.g., a set or predetermined signal or voltage) to pixels apart from each other with the component area OA therebetween. Though it is shown in FIG. 2A that the wiring lines WL do not overlap the sealing material 350 in the first non-display area NDA1, a portion of the sealing material 350 may overlap the wiring lines WL according to some example embodiments.

The display panel 10 may include a through hole 10H corresponding to the component area OA. For example, the substrate 100 and the encapsulation substrate 300 may respectively include through holes 100H and 300H each corresponding to the component area OA. The display layer 200 may include a through hole corresponding to the component area OA.

According to some example embodiments, elements such as an input sensing member, a reflection prevention member, and a transparent window may be further arranged on the display panel 10, the input sensing member sensing a touch input, and the reflection prevention member including a polarizer and a retarder, or a color filter and a black matrix.

The component 20 may be located in the component area OA. The component 20 may be an electronic element that uses light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. As shown in FIG. 2A, in the case where the display panel 10 includes a through hole 10H corresponding to the component area OA, light or sound output from or received by the electronic element may be more effectively utilized.

Figure 2B:
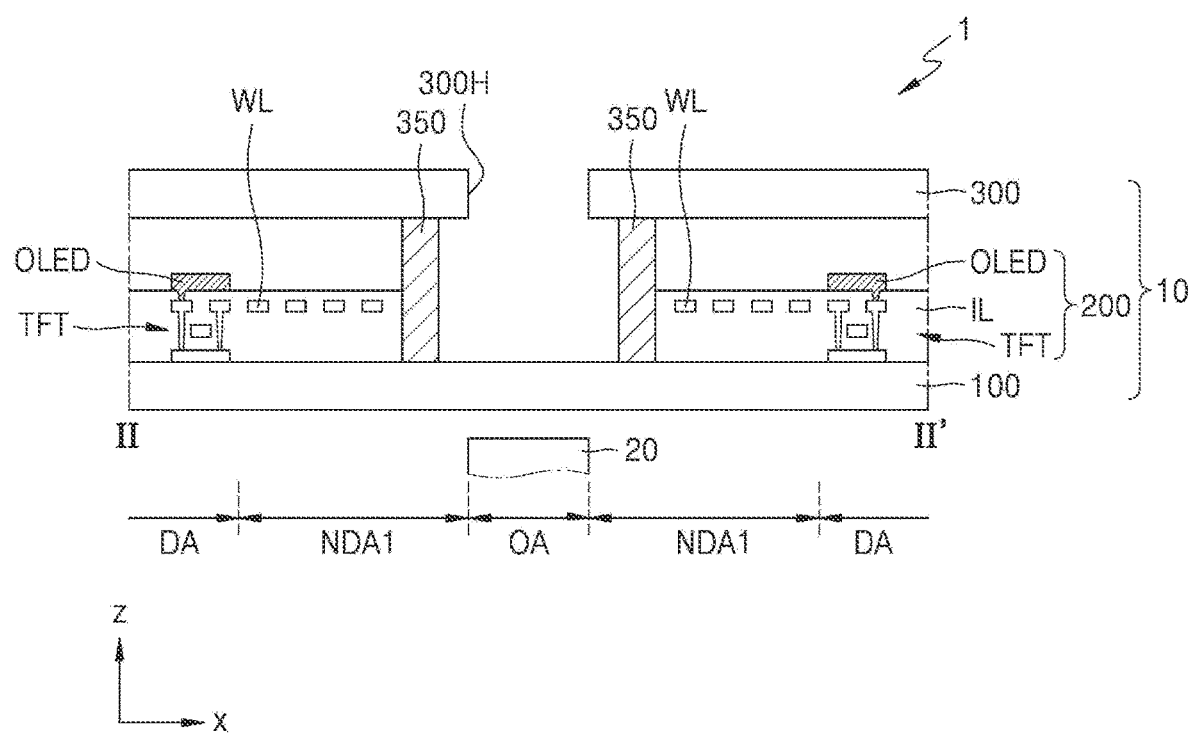

Unlike the display panel 10 including the through hole 10H corresponding to the component area OA, some of elements of the display panel 10 may not include a through hole. For example, as shown in FIG. 2B, the encapsulation substrate 300 includes the through hole 300H corresponding to the component area OA, but the substrate 100 may not include a through hole.

Figure 2C:
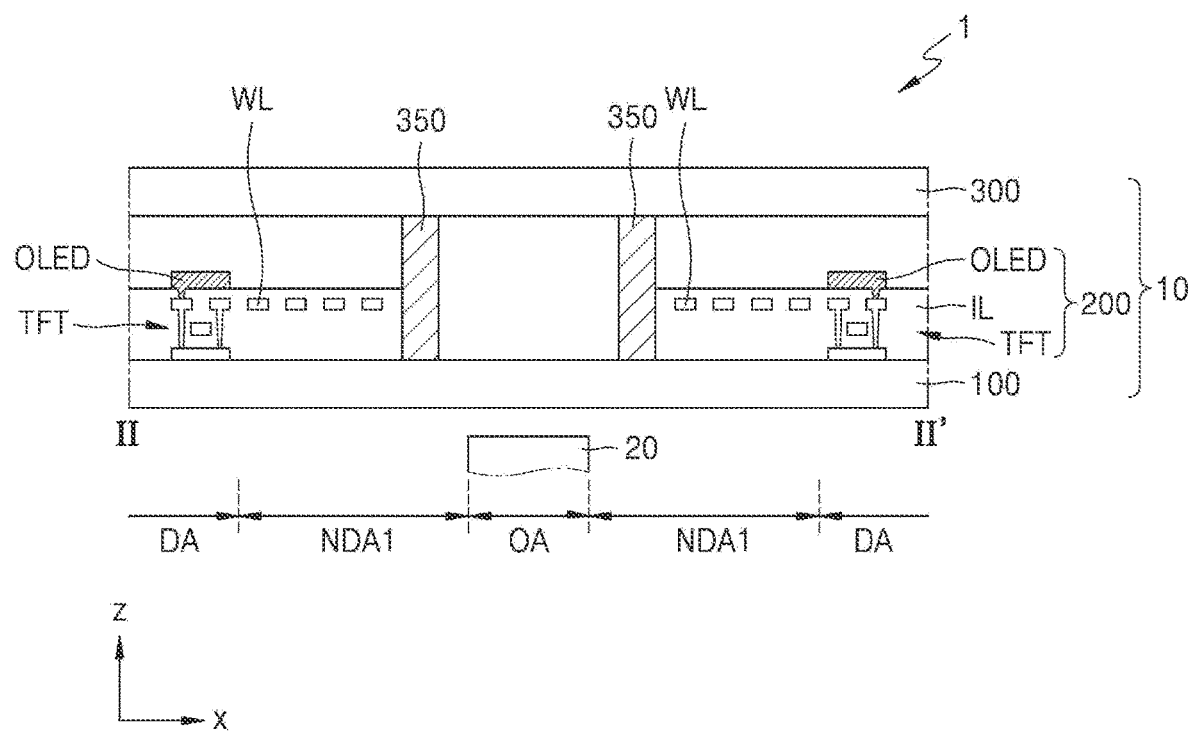
Figure 2D:
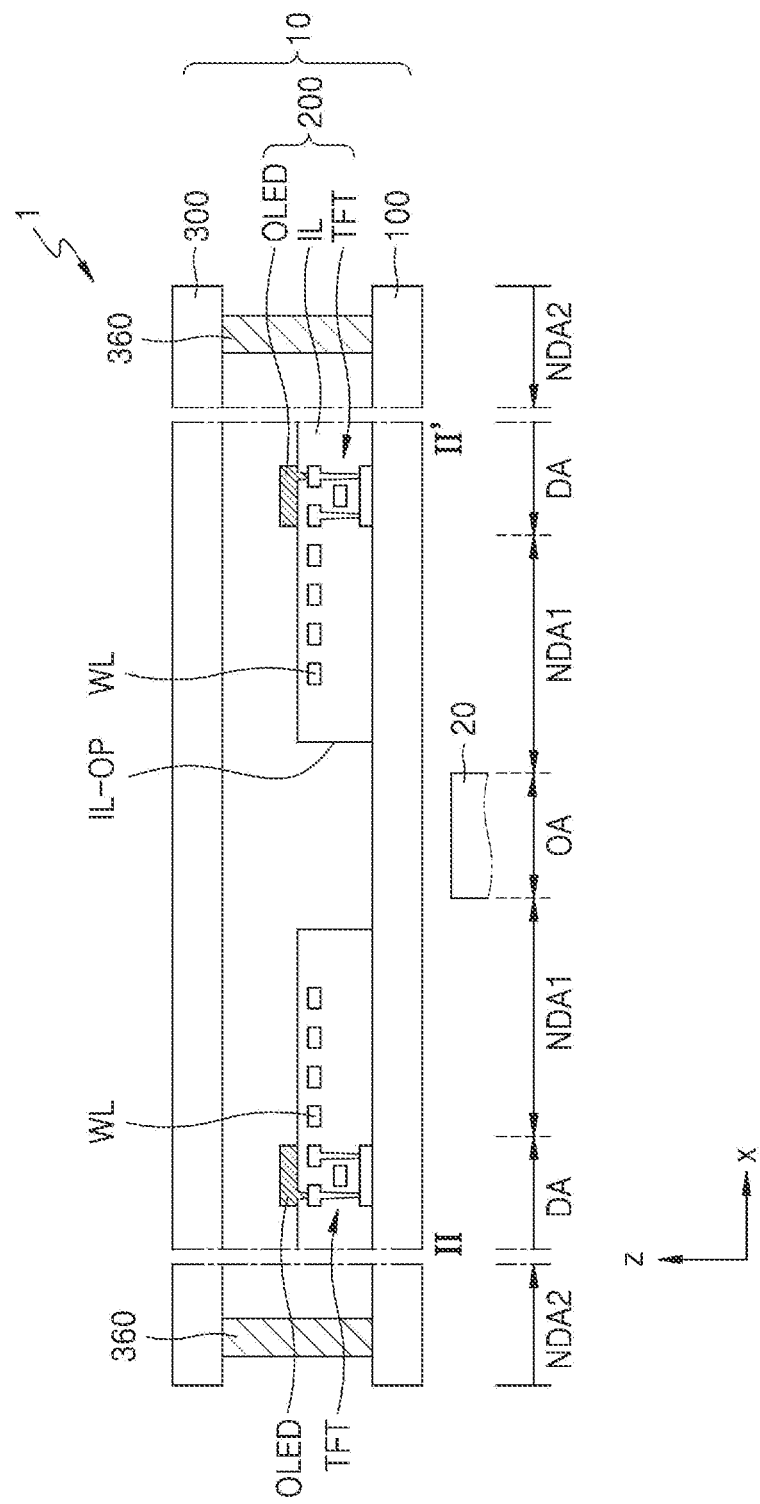

Alternatively, as shown in FIGS. 2C and 2D, both the substrate 100 and the encapsulation substrate 300 may not include the through holes corresponding to the component area OA. In FIG. 2C, the sealing material 350 may be arranged in the first non-display area NDA1 to surround the component area OA.

Unlike FIG. 2C, the sealing material 350 may not be provided around the component area OA in FIG. 2D. An outer sealing material 360 may be located in the second non-display area NDA2 and may seal the display layer 200 from external air by bonding the substrate 100 to the encapsulation substrate 300. According to some example embodiments, the display device 1 of FIGS. 2A to 2C may also include the outer sealing material 360 that surrounds the display area DA.

An insulating layer IL of FIG. 2D may have an opening IL-OP corresponding to the component area OA. According to some example embodiments, in the component area OA, any element may not be arranged between the substrate 100 and the encapsulation substrate 300. According to some example embodiments, a portion of an inorganic insulating layer(s) such as a buffer layer may remain in the component area OA of the substrate 100.

Though it is shown in FIGS. 2A to 2D that the component 20 is located below the display panel 10, that is, located on one side of the substrate 100, the component 20 may be at least partially inserted and located inside the through hole 10H so as to overlap lateral sides of the display panel 10 that define the through hole 10H in FIG. 2A.

The component 20 may include another member besides the electronic element. According to some example embodiments, in the case where the display device 1 is used as a smartwatch or an instrument panel for an automobile, the component 20 may be a member such as clock hands or a needle indicating information (e.g., set or predetermined information) (e.g. the velocity of a vehicle, etc.). Alternatively, the component 20 may include an element such as an accessory that increases aesthetic sense of the display panel 10.

Figure 3A:
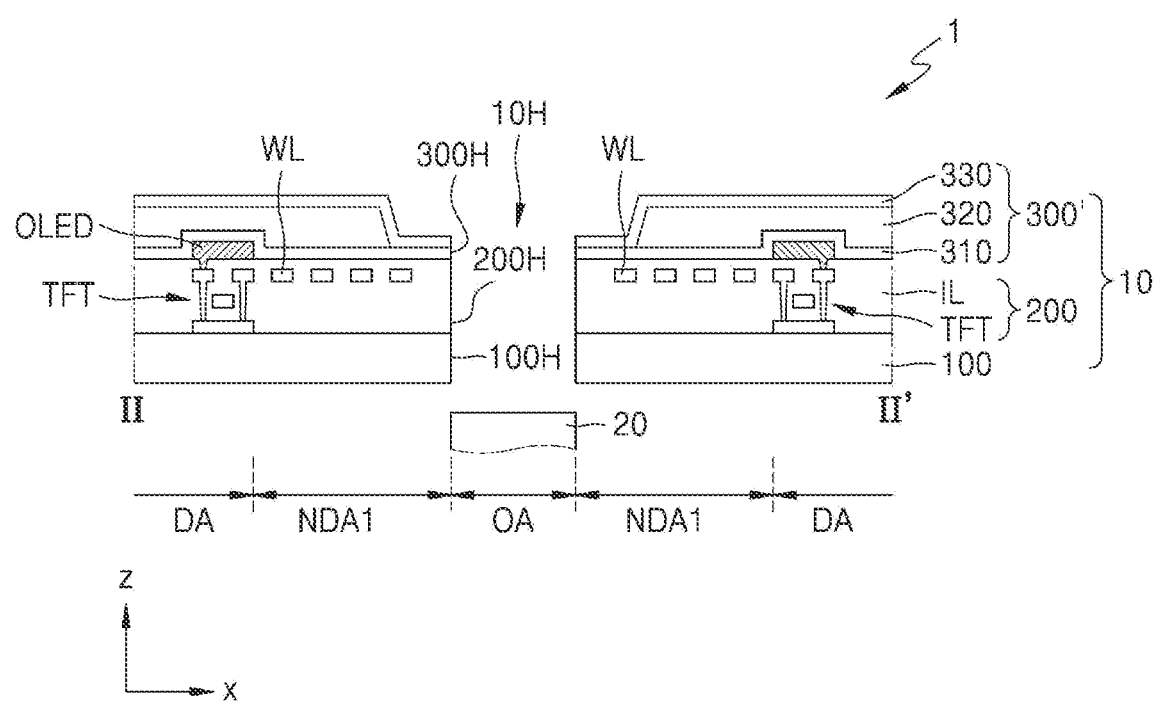
FIGS. 3A to 3C are cross-sectional views of a display device according to some example embodiments.
Figure 3B:
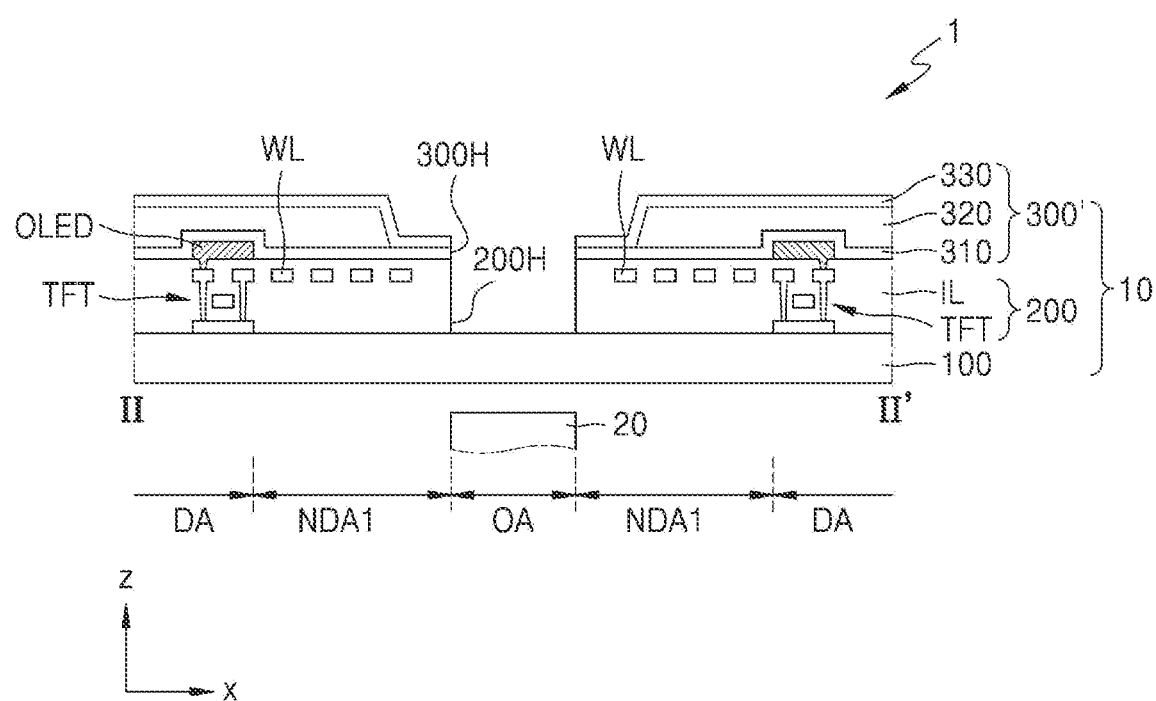
Figure 3C:
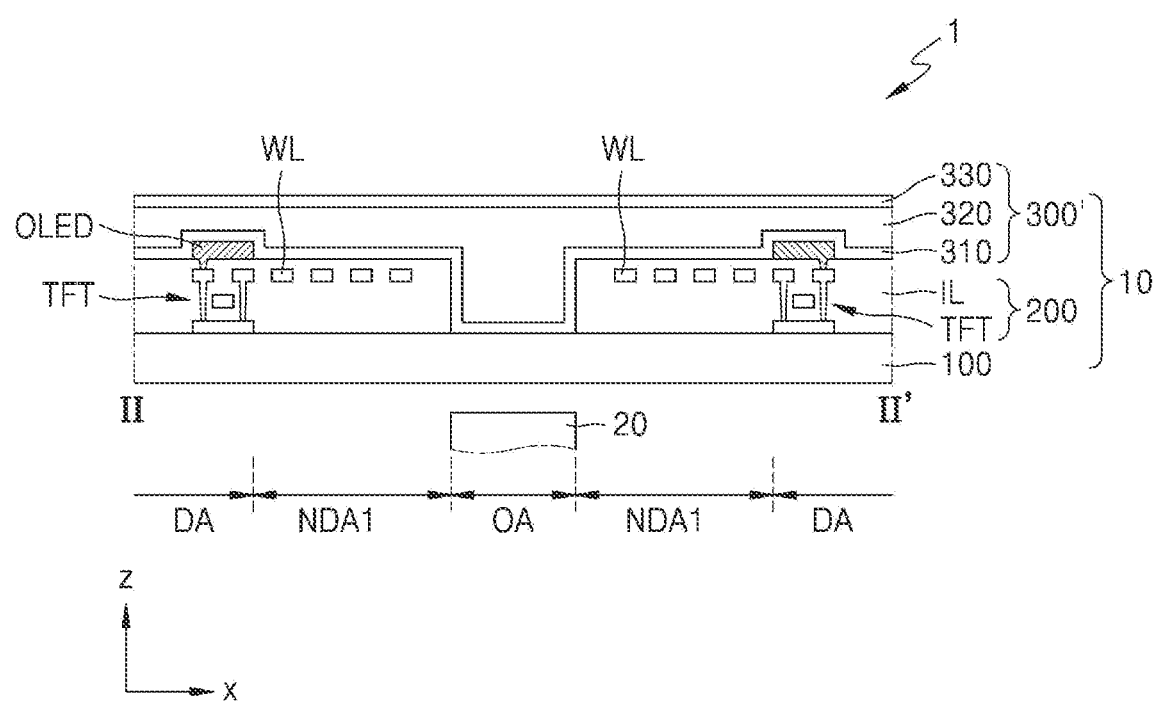

FIGS. 3A to 3C are cross-sectional views of the display device 1 according to other embodiments and may correspond to cross-sections of the display device 1 taken along the line II-II' of FIG. 1.

Referring to FIG. 3A, like the display device 1 described with reference to FIG. 2A, the display device 1 may include the display panel 10 and the component 20. Also, according to some example embodiments, the display device 1 may further include an input sensing member sensing a touch input, a reflection prevention member, a window, etc. arranged on the display panel 10.

Unlike the display panel 10 including the encapsulation substrate 300 as an encapsulation member and the sealing material 350 described above with reference to FIG. 2A, the display panel 10 according to the present embodiment may include a thin-film encapsulation layer 300' as an encapsulation member. In the case where the display panel 10 includes the thin-film encapsulation layer 300' as an encapsulation member, the flexibility of the display panel 10 may be improved even more. Hereinafter, for convenience of description, a difference is mainly described.

The thin-film encapsulation layer 300' may include at least one inorganic encapsulation layer and at least one organic encapsulation layer. For example, as shown in FIG. 3A, the thin-film encapsulation layer 300' may include a first inorganic encapsulation layer 310, a second inorganic encapsulation layer 330, and an organic encapsulation layer 320 therebetween.

The first and second inorganic encapsulation layers 310 and 330 may include a suitable inorganic encapsulation layer material, for example, at least one inorganic insulating material selected from the group consisting of aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and silicon oxynitride (SiON). The organic encapsulation layer 320 may include a polymer-based material. The polymer-based material may include an acryl-based resin, an epoxy-based resin, polyimide, and polyethylene.

The display panel 10 may include the through hole 10H corresponding to the component area OA. For example, the substrate 100, the display layer 200, and the thin-film encapsulation layer 300' may respectively include through holes 100H, 200H, and 300H each corresponding to the component area OA. The thin-film encapsulation layer 300', for example, the first inorganic encapsulation layer 310, the second inorganic encapsulation layer 330, and the organic encapsulation layer 320 each may include holes corresponding to the component area OA. A size of the hole of the organic encapsulation layer 320 may be greater than sizes of the holes of the first and second inorganic encapsulation layers 310 and 330, and thus the first inorganic encapsulation layer 310 may contact the second inorganic encapsulation layer 330 around the component area OA.

Unlike FIG. 3A, some elements of the display panel 10 may not include a through hole. As shown in FIG. 3B, the display layer 200 and the thin-film encapsulation layer 300' may respectively include the through holes 200H and 300H corresponding to the component area OA, but the substrate 100 may not include a through hole.

According to some example embodiments, as shown in FIG. 3C, all of the substrate 100, the display layer 200, and the thin-film encapsulation layer 300' may not include through holes corresponding to the component area OA.

Even though the substrate 100 does not include the through hole 100H as shown in FIGS. 3B and 3C, portions of the display layer 200 that correspond to the component area OA may be at least partially removed and thus a light transmittance for the electronic element, which is the component 20, may be secured.

In the case where the thin-film encapsulation layer 300' does not include the through hole, the at least one inorganic encapsulation layer and the at least one organic encapsulation layer each may cover a portion of the substrate 100 in the component area OA. For example, the display layer 200 arranged between the substrate 100 and the thin-film encapsulation layer 300' may not cover a portion of the substrate 100 that corresponds to the component area OA. The portion of the substrate 100 that corresponds to the component area OA may be covered by the thin-film encapsulation layer 300'.

Though it is shown in FIGS. 3A to 3C that all of the insulating layer IL corresponding to the component area OA is removed, some layers of the insulating layer IL, which is a multi-layer, corresponding to the component area OA may be removed in the display panel 10 according to some example embodiments.

Though it is shown in FIGS. 3A to 3C that the component 20 is located below the display panel 10, that is, located on one side of the substrate 100, the component 20 may be at least partially inserted and located inside the through hole 10H so as to overlap lateral sides of the display panel 10 that define the through hole 10H in FIG. 3A.

Figure 4A:
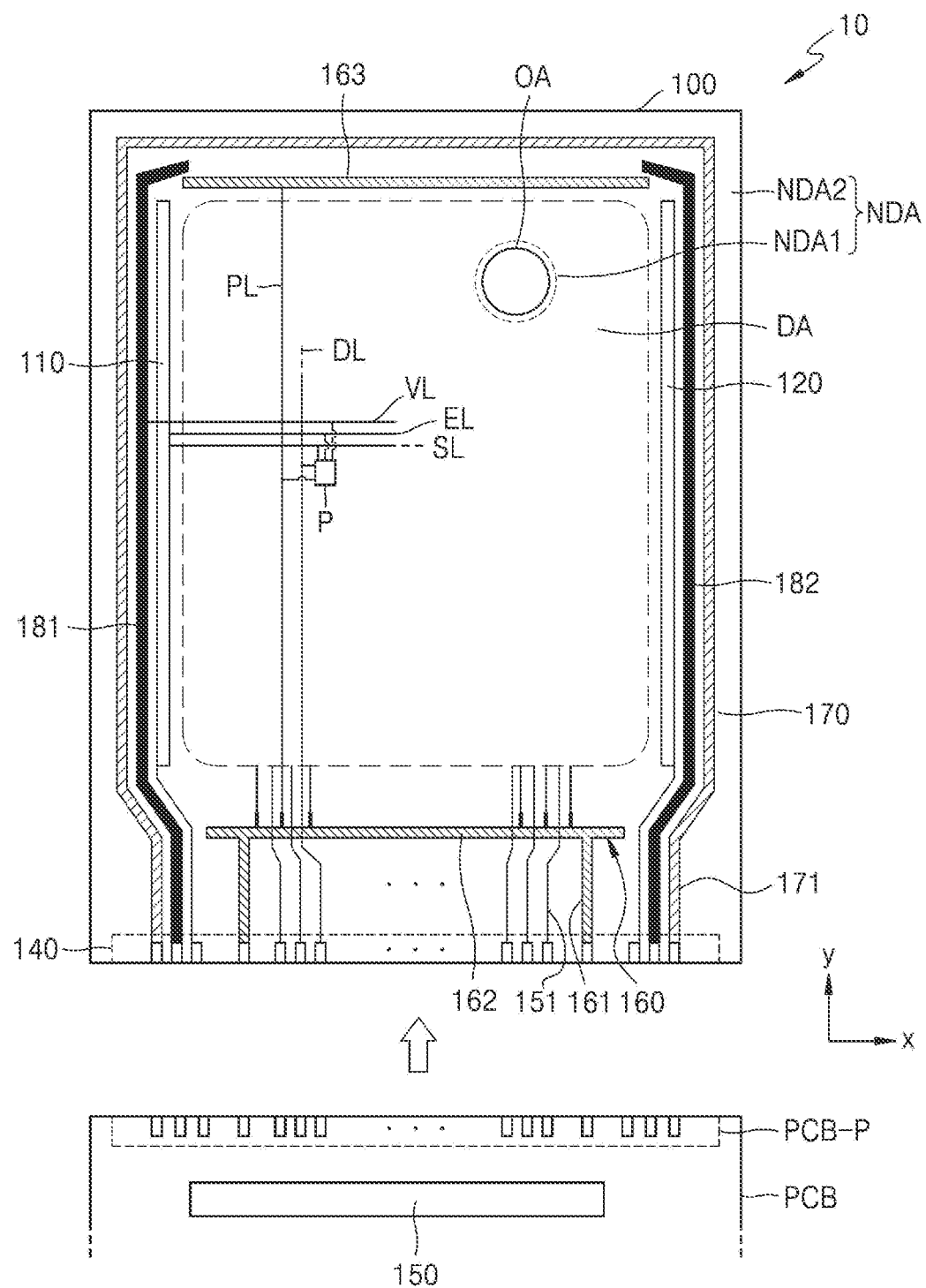
FIG. 4A is a plan view of a display panel according to some example embodiments.
Figure 4B:
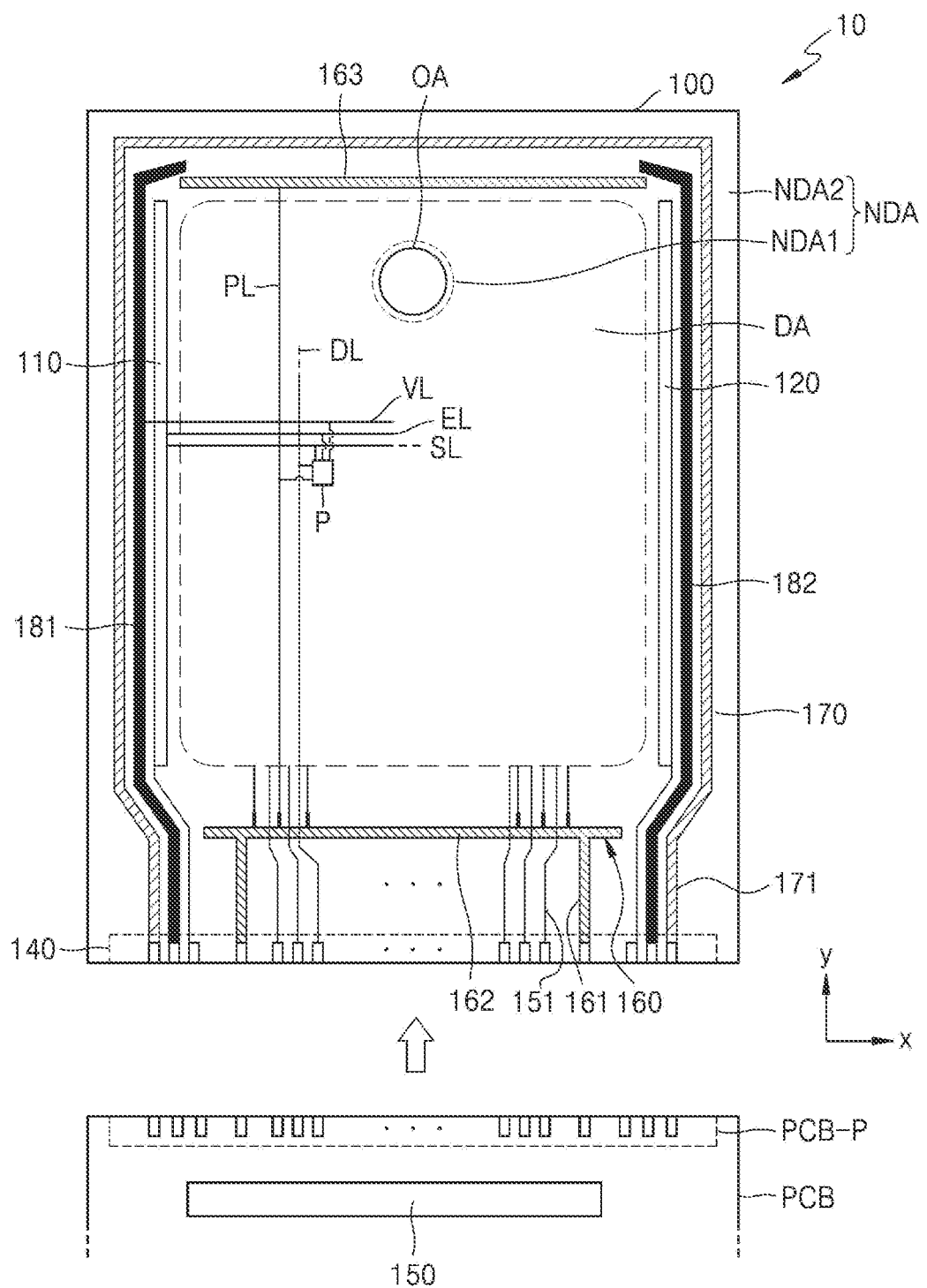
FIG. 4B is a plan view of a display panel according to some example embodiments.
Figure 5:
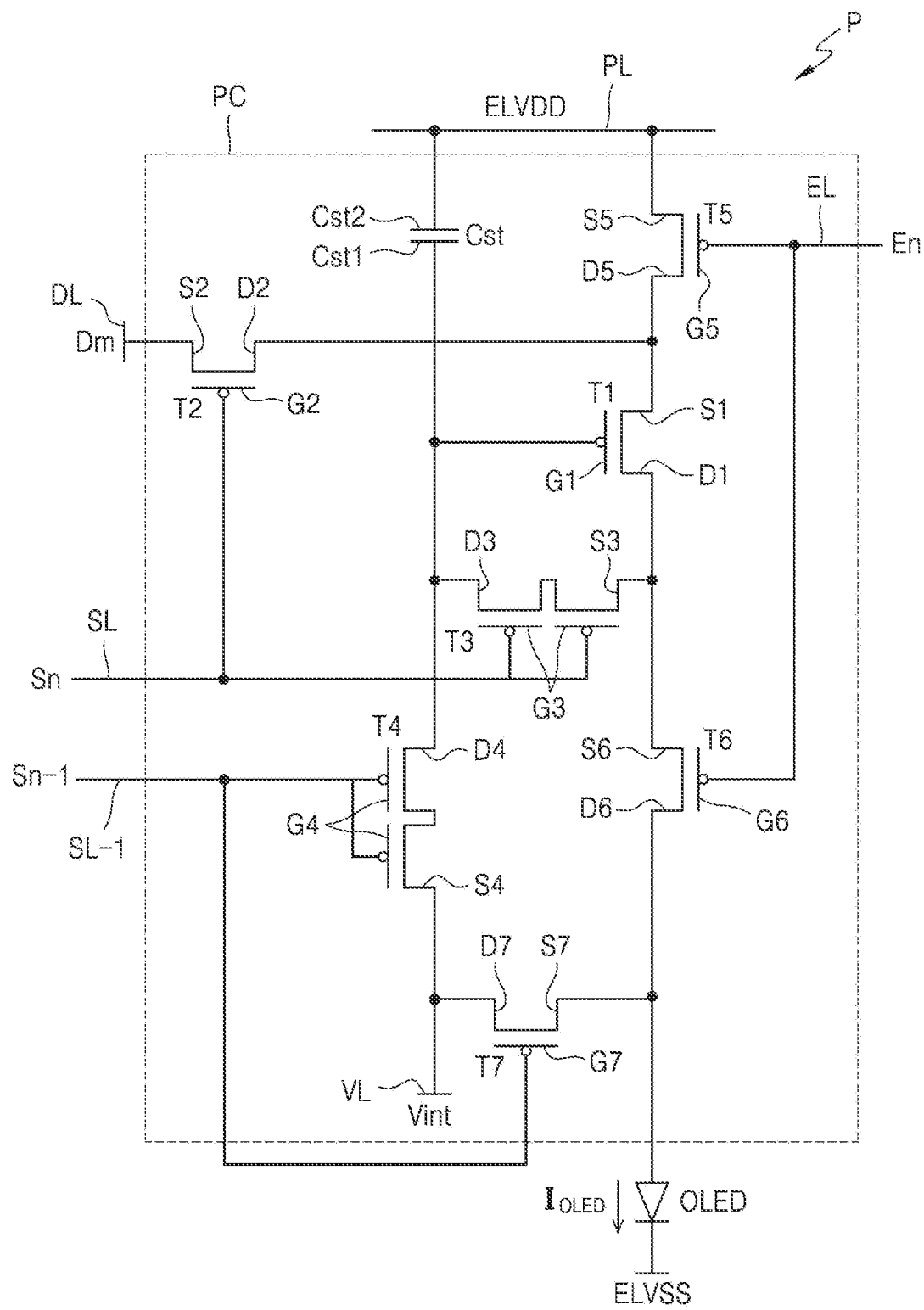
FIG. 5 is an equivalent circuit diagram of one of pixels of a display panel according to some example embodiments.

FIGS. 4A and 4B are plan views of the display panel 10 according to some example embodiments, and FIG. 5 is an equivalent circuit diagram of one of pixels of the display panel 10 according to some example embodiments.

Referring to FIG. 4A, the display panel 10 may include a plurality of pixels P arranged in the display area DA. Each pixel P may include a display element such as an organic light-emitting diode. Each pixel P may emit, for example, red, green, blue, or white light through an organic light-emitting diode. In the present specification, a pixel P may be a sub-pixel that emits red, green, blue, or white light as described above.

As shown in FIG. 5, a pixel P may include a pixel circuit PC and an organic light-emitting diode OLED electrically connected to the pixel circuit PC. The pixel circuit PC may include a plurality of thin film transistors and a storage capacitor. The plurality of thin film transistors and the storage capacitor may be connected to signal lines SL, SL−1, EL, and DL, an initialization voltage line VL, and a driving voltage line PL.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL, a previous scan line SL−1, the emission control line EL, and the data line DL, the scan line SL transferring a scan signal Sn, the previous scan line SL−1 transferring a previous scan signal Sn−1 to the first initialization thin film transistor T4 and the second initialization thin film transistor T7, the emission control line EL transferring an emission control signal En to the operation control thin film transistor T5 and the emission control thin film transistor T6, and the data line DL intersecting with the scan line SL and transferring a data signal Dm.

The driving voltage line PL transfers a driving voltage ELVDD (also referred to as first power) to the driving thin film transistor T1. The initialization voltage line VL transfers an initialization voltage Vint initializing the driving thin film transistor T1 and a pixel electrode of the organic light-emitting diode OLED.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of an organic light-emitting diode OLED through the emission control thin film transistor T6. The driving thin film transistor T1 receives a data signal Dm depending on a switching operation of the switching thin film transistor T2 and supplies a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and simultaneously connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and simultaneously connected to the pixel electrode of the organic light-emitting diode OLED through the emission control thin film transistor T6. A compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and may compensate for the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL. A first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL-1 and transfers an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL. An operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow the driving voltage ELVDD to be transferred to the organic light-emitting diode OLED and thus the driving current $I_{OLED}$ to flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED. The second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL-1 and may initialize the pixel electrode of the organic light-emitting diode OLED.

Though FIG. 5 shows the case where the first initialization thin film transistor T4 and the second initialization thin film transistor T7 are connected to the previous scan line SL-1, the embodiment is not limited thereto. For example, according to some example embodiments, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A second storage capacitor plate Cst2 of the storage capacitor Cst is connected to the driving voltage line PL, and an opposite electrode of the organic light-emitting diode OLED is connected to a common voltage ELVSS (also referred to as second power). Therefore, the organic light-emitting diode OLED may receive the driving current $I_{OLED}$ from the driving thin film transistor T1 and emit light to thereby display an image.

Though it is shown in FIG. 5 that the compensation thin film transistor T3 and the first initialization thin film transistor T4 each have a dual gate electrode, the compensation thin film transistor T3 and the first initialization thin film transistor T4 each may have one gate electrode.

Referring to FIG. 4A again, each pixel P may be electrically connected to driving circuits arranged in the non-display area, for example, the second non-display area NDA2. A first scan driving circuit 110, a second scan driving circuit 120, a terminal 140, a data driving circuit 150, a first power supply line 160, a second power supply line 170, a first initialization power supply line 181, and a second initialization power supply line 182 may be arranged in the second non-display area NDA2.

The first scan driving circuit 110 may supply a scan signal to each pixel P through a scan line SL. The first scan driving circuit 110 may provide an emission control signal to each pixel P through an emission control line EL. The second scan driving circuit 120 may be parallel to the first scan driving circuit 110 with the display area DA therebetween. Some of the pixels P arranged in the display area DA may be electrically connected to the first scan driving circuit 110. The other pixels P that are not connected to the first scan driving circuit 110 may be electrically connected to the second scan driving circuit 120. According to some example embodiments, one of the first scan driving circuit 110 and the second scan driving circuit 120 may be omitted.

The terminal 140 may be arranged on one side of the substrate 100. The terminal 140 may be exposed and electrically connected to a printed circuit board PCB by not being covered by an insulating layer. A terminal PCB-P of the printed circuit board PCB may be electrically connected to the terminal 140 of the display panel 10. The printed circuit board PCB transfers a signal of a controller or power to the display panel 10. The printed circuit board PCB may transfer a control signal generated by the controller to the first scan driving circuit 110 and the second scan driving circuit 120.

The data driving circuit 150 may be electrically connected to the data line DL. A data signal of the data driving circuit 150 may be provided to each pixel P through a connection line 151 connected to the terminal 140, and the data line DL connected to the connection line 151. Though it is shown in FIGS. 4A and 4B that the data driving circuit 150 is arranged on the printed circuit board PCB, the data driving circuit 150 may be arranged on the substrate 100 according to some example embodiments. For example, the data driving circuit 150 may be arranged between the terminal 140 and the first power supply line 160.

The first power supply line 160 may include a first sub-line 162 and a second sub-line 163 each being parallel to each other with the display area DA therebetween and extending in an x-direction. The driving voltage line PL extending so as to cross the display area DA may be connected to the first sub-line 162 and the second sub-line 163. The second power supply line 170 may have a loop shape having one open side and partially surround the display area DA. The first power supply line 160 may provide the first power ELVDD (see FIG. 5) to each pixel P, and the second power supply line 170 may provide the second power ELVSS (see FIG. 5) to each pixel P as described above.

The first and second initialization power supply lines 181 and 182 may be arranged in the second non-display area NDA2. The first and second initialization power supply lines 181 and 182 respectively have shapes at least surrounding the left and the right of the display area DA and may extend in a y-direction. For example, the first and second initialization power supply lines 181 and 182 may be apart from each other with the display area DA therebetween. The first and second initialization power supply lines 181 and 182 may extend in the y-direction and a portion of the first and second initialization power supply lines 181 and 182 may have a shape bent toward the display area DA along an edge corner of the display area DA. The first and second initialization power supply lines 181 and 182 may provide an initialization voltage to each pixel P through the initialization voltage line VL.

The component area OA may be located inside the display area DA. The plurality of pixels P may be arranged around the component area OA. The plurality of pixels P may surround the component area OA.

As shown in FIG. 4A, the component area OA may be arranged in an upper right portion of the display area DA. According to some example embodiments, as shown in FIG. 4B, the component area OA may be arranged in an upper central portion of the display area DA. For example, in the case where the component area OA is arranged in a central portion of the display area DA, a difference in an emission characteristic between pixels P on the left of the component area OA and pixels P on the right of the component area OA may be reduced. According to some example embodiments, the component area OA may be arranged in various locations inside the display area DA such as an upper left portion, a lower right portion, a lower left portion, and a central portion inside the display area DA. Though it is shown in FIGS. 4A and 4B that one component area OA is provided, the component area OA may be provided as a plurality of component areas inside the display area OA according to some example embodiments.

Detouring lines may be arranged in the first non-display area NDA1, the detouring lines applying a signal or power (e.g., a set or predetermined signal or power) to pixels P apart from each other around the component area OA. A relevant structure is described below with reference to FIG. 8.

The display panel described with reference to FIGS. 4A and 4B may be a figure of the substrate 100. For example, the substrate 100 may include a first area, a second area, a third area, and a fourth area, the first area corresponding to the component area OA, the second area corresponding to the display area DA, the third area corresponding to the first non-display area NDA1, and the fourth area corresponding to the second non-display area NDA2. A plurality of pixels P are arranged in the second area of the substrate 100 to constitute the display area DA of the display panel that may display an image. The fourth area of the substrate 100 is an outer area of the substrate 100 that surrounds the second area. The first scan driving circuit 110, the second scan driving circuit 120, the terminal 140, the data driving circuit 150, the first power supply line 160, the second power supply line 170, the first initialization power supply line 181, and the second initialization power supply line 182 may be arranged in the fourth area.

Figure 6A:
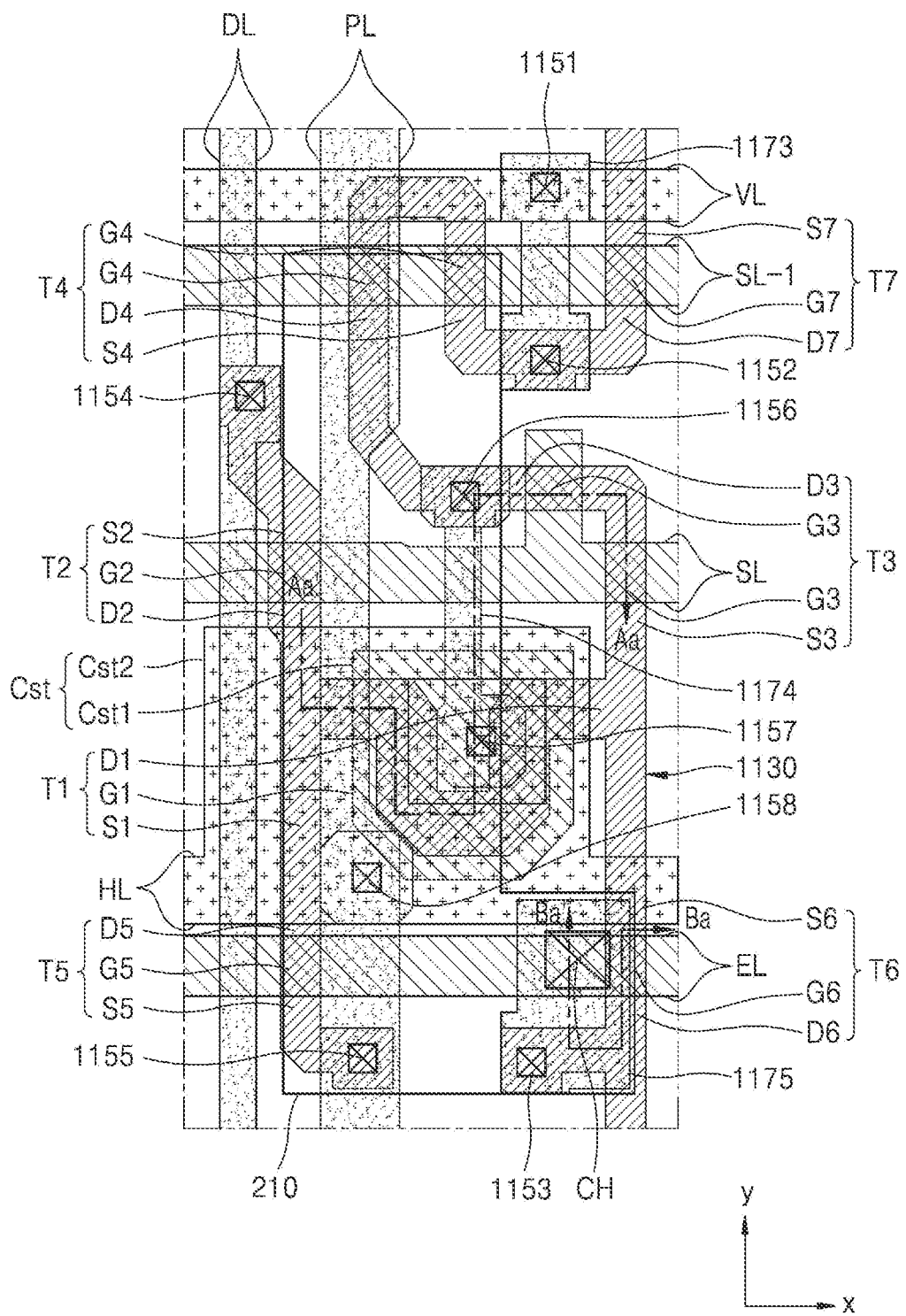
FIGS. 6A and 6B are plan views of one of pixels of a display panel according to some example embodiments.
Figure 6B:
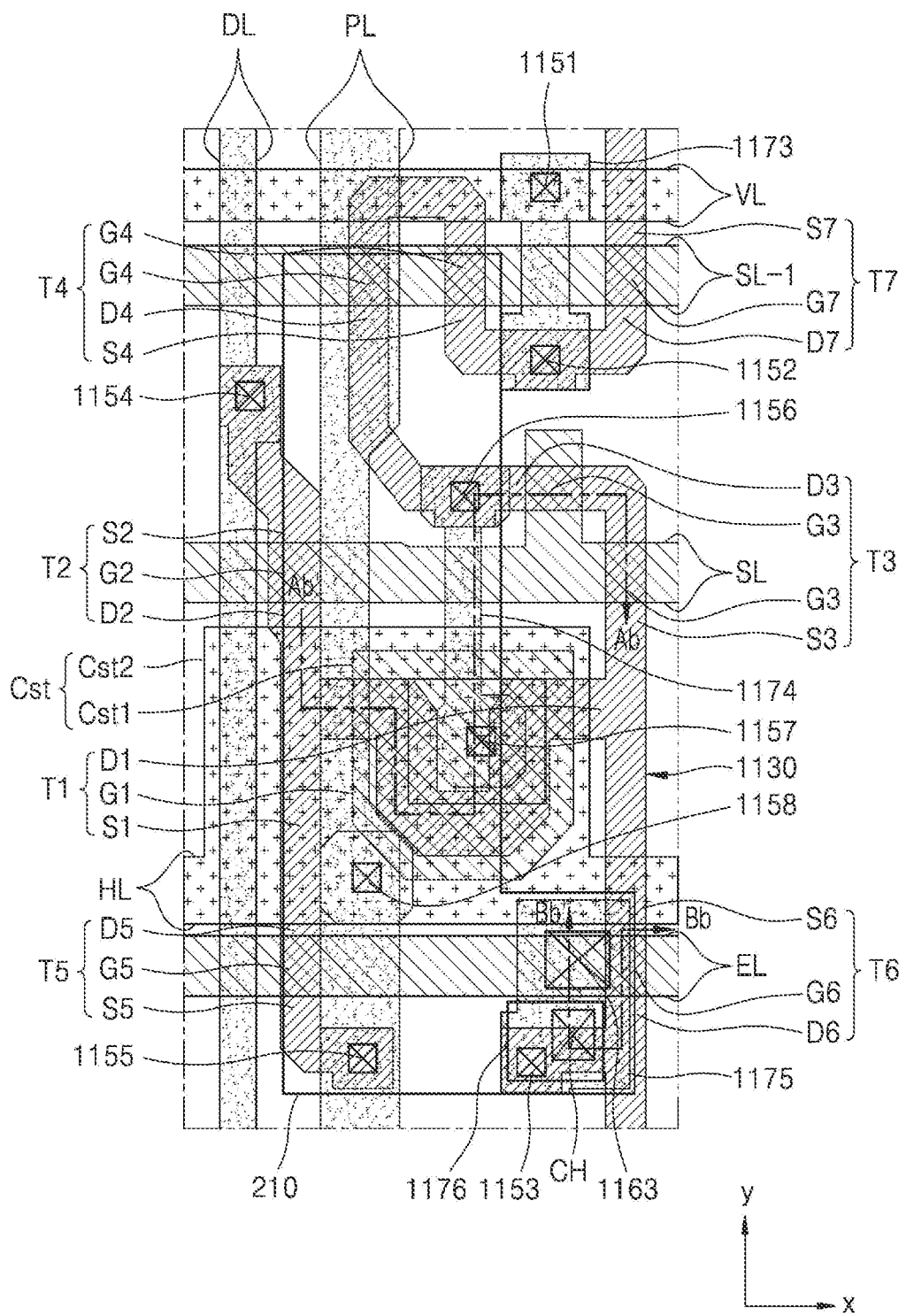
Figure 7A:
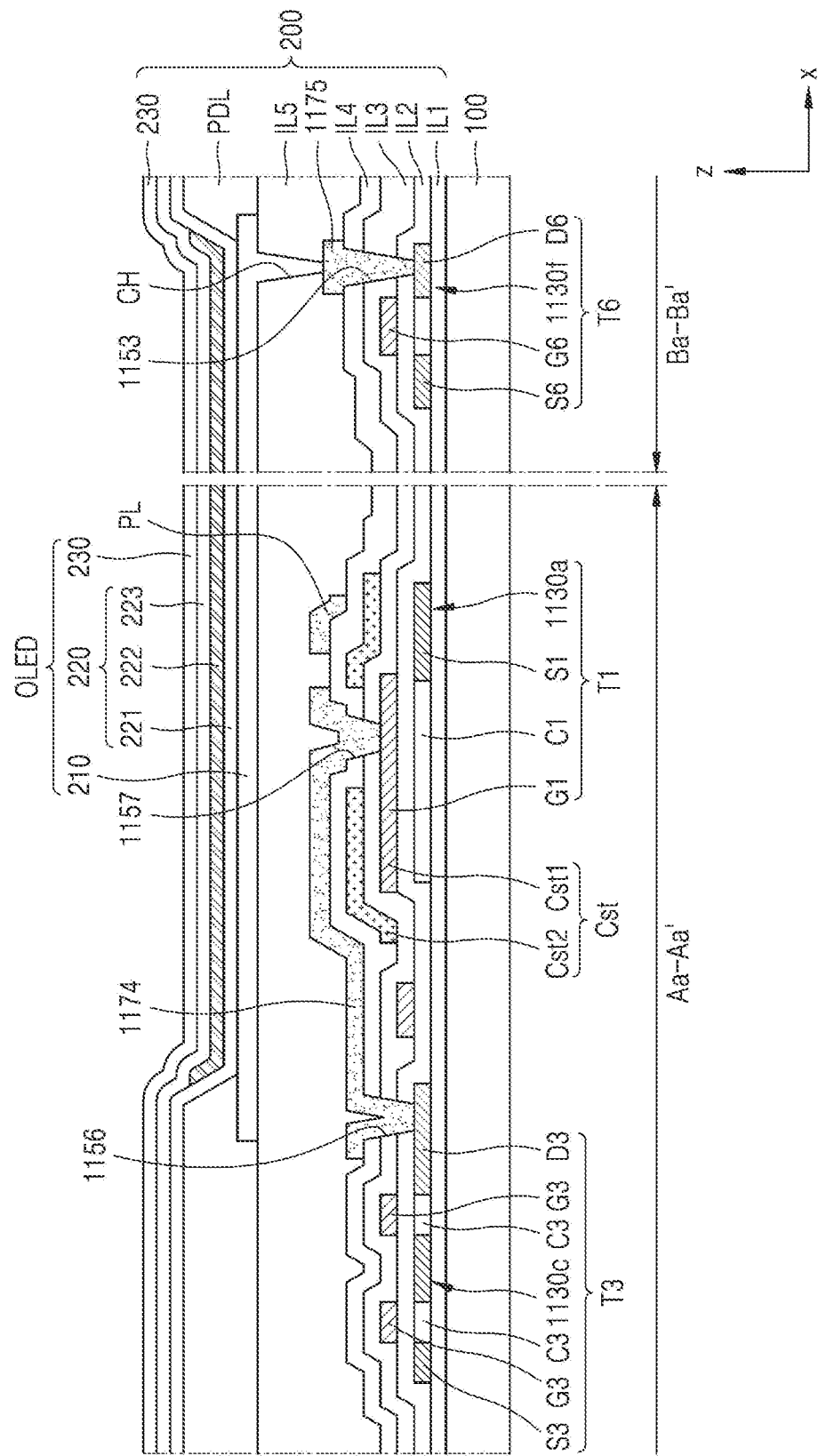
FIGS. 7A and 7B are cross-sectional views of the pixel taken along the lines Aa-Aa' and Ba-Ba' of FIGS. 6A and 6B.
Figure 7B:
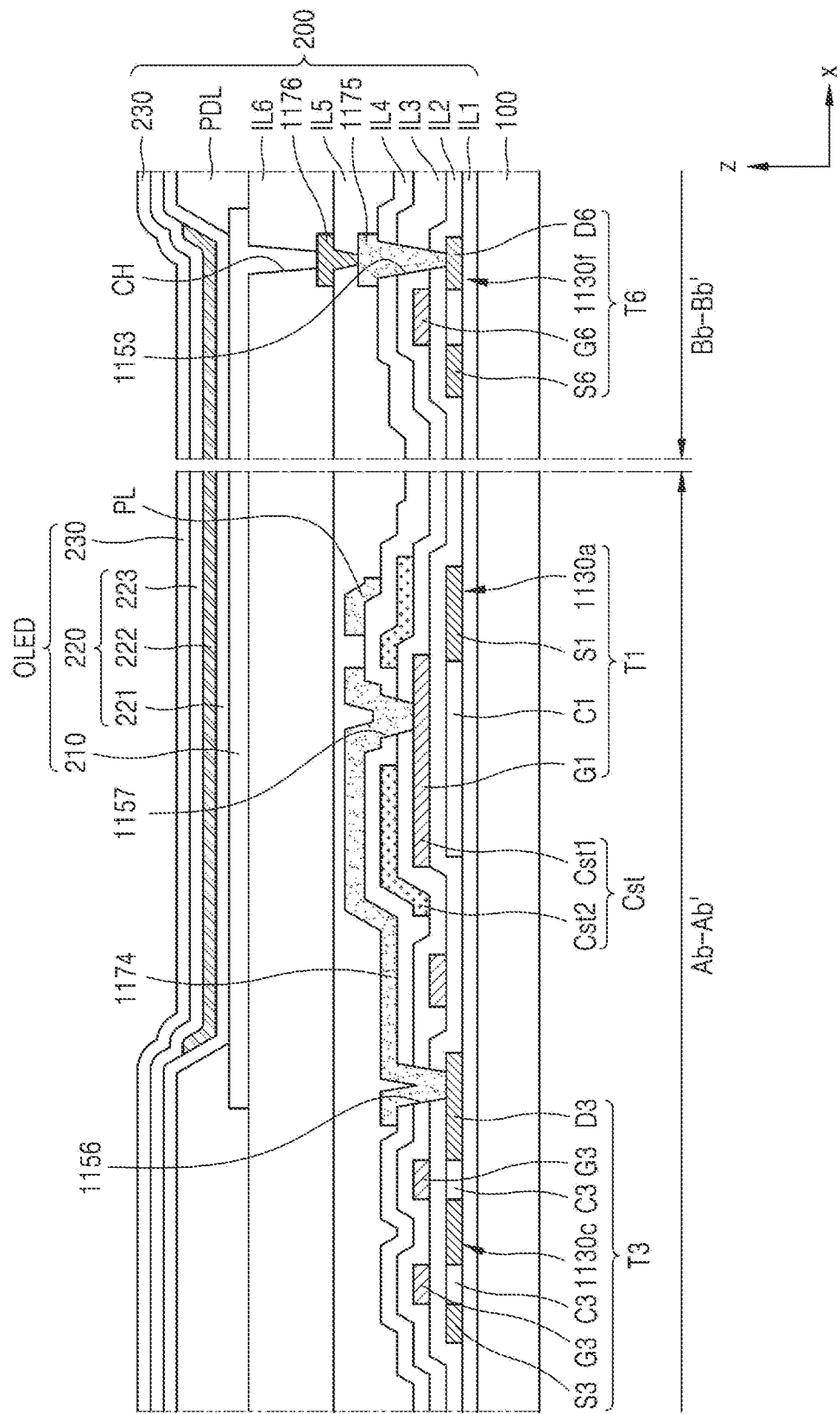

FIGS. 6A and 6B are plan views of one of pixels of a display panel according to some example embodiments, and FIGS. 7A and 7B are cross-sectional views of the pixel taken along the lines Aa-Aa' and Ba-Ba' of FIGS. 6A and 6B.

Referring to FIGS. 6A and 7A, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be arranged along a semiconductor layer 1130.

Some regions of the semiconductor layer 1130 may correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to each other and may have a shape bent in various directions.

The semiconductor layer 1130 is located over the substrate 100. It is shown in FIG. 7A that a portion of the semiconductor layer 1130, for example, a driving semiconductor layer 1130a, a compensation semiconductor layer 1130c, and an emission control semiconductor layer 1130f are located over the substrate 100.

A buffer layer IL1 may be formed under the semiconductor layer 1130, the buffer layer IL1 including an inorganic material such as silicon oxide, silicon nitride, and silicon oxynitride.

The semiconductor layer 1130 may include a channel region, a source region, and a drain region, the source region and the drain region being on two opposite sides of the channel region. The source region and the drain region may be respectively a source electrode and a drain electrode of a thin film transistor. Hereinafter, for convenience of description, a source region and a drain region are respectively referred to as a source electrode and a drain electrode.

The driving thin film transistor T1 includes the driving gate electrode G1, the driving source electrode S1, and the driving drain electrode D1, the driving gate electrode G1 overlapping a driving channel region, and the driving source electrode S1 and the driving drain electrode D1 being on two opposite sides of the driving channel region. The driving channel region overlapped with the driving gate electrode G1 may form a long channel length in a narrow space by having a structure bent in various shapes. For example, in the case where a length of the driving channel region is formed long, a driving range of a gate voltage widens and gradation of light emitted from an organic light-emitting diode OLED may be more elaborately controlled, and a display quality may be improved.

The switching thin film transistor T2 includes the switching gate electrode G2, the switching source electrode S2, and the switching drain electrode D2, the switching gate electrode G2 overlapping a switching channel region, and the switching source electrode S2 and the switching drain electrode D2 being on two opposite sides of the switching channel region. The switching drain electrode D2 may be connected to the driving source electrode S1.

The compensation thin film transistor T3 is a dual thin film transistor and may include the compensation gate electrodes G3, the compensation source electrode S3, and the compensation drain electrode D3, the compensation gate electrodes G3 overlapping two compensation channel regions, and the compensation source electrode S3 and the compensation drain electrode D3 being on two opposite sides of the compensation channel region. The compensation thin film transistor T3 may be connected to the driving gate electrode G1 of the driving thin film transistor T1 through a node connection line 1174 described below.

The first initialization thin film transistor T4 is a dual thin film transistor and may include the first initialization gate electrodes G4, the first initialization source electrode S4, and the first initialization drain electrode D4, the first initialization gate electrodes G4 overlapping two first initialization channel regions, and the first initialization source electrode S4 and the first initialization drain electrode D4 being on two opposite sides of the first initialization channel region.

The operation control thin film transistor T5 may include the operation control gate electrode G5, the operation control source electrode S5, and the operation control drain electrode D5, the operation control gate electrode G5 overlapping an operation control channel region, and the operation control source electrode S5 and the operation control drain electrode D5 being on two opposite sides of the operation control channel region. The operation control drain electrode D5 may be connected to the driving source electrode S1.

The emission control thin film transistor T6 may include the emission control gate electrode G6, the emission control source electrode S6, and the emission control drain electrode D6, the emission control gate electrode G6 overlapping an emission control channel region, and the emission control source electrode S6 and the emission control drain electrode D6 being on two opposite sides of the emission control channel region. The emission control source electrode S6 may be connected to the driving drain electrode D1.

The second initialization thin film transistor T7 may include the second initialization gate electrode G7, the second initialization source electrode S7, and the second initialization drain electrode D7, the second initialization gate electrode G7 overlapping a second initialization channel region, and the second initialization source electrode S7 and the second initialization drain electrode D7 being on two opposite sides of the second initialization channel region.

The above-described thin film transistors may be connected to the signal lines SL, SL−1, EL, and DL, the initialization voltage line VL, and the driving voltage line PL.

A gate insulating layer IL2 (see FIG. 7A) may be arranged on the semiconductor layer 1130. The scan line SL, the previous scan line SL−1, the emission control line EL, and the driving gate electrode G1 may be arranged on the gate insulating layer IL2.

The gate insulating layer IL2 may include an inorganic material such as silicon oxide, silicon nitride, and silicon oxynitride. The scan line SL, the previous scan line SL−1, the emission control line EL, and the driving gate electrode G1 may include a metal such as molybdenum (Mo), aluminum (Al), copper (Cu), titanium (Ti), and an alloy thereof.

The scan line SL may extend in the x-direction. Some regions of the scan line SL may respectively correspond to the switching and compensation gate electrodes G2 and G3. For example, regions of the scan line SL that overlap the switching and compensation thin film transistors T2 and T3 may be the switching and compensation gate electrodes G2 and G3, respectively.

The previous scan line SL−1 may extend in the x-direction and some regions of the previous scan line SL−1 may respectively correspond to the first and second initialization gate electrodes G4 and G7. For example, regions of the previous scan line SL−1 that overlap the channel regions of the first and second initialization thin film transistors T4 and T7 may be the first and second initialization gate electrodes G4 and G7, respectively.

The emission control line EL may extend in the x-direction. Some regions of the emission control line EL may respectively correspond to the operation control and emission control gate electrodes G5 and G6. For example, regions of the emission control line EL that overlap the channel regions of the operation control and emission control thin film transistors T6 and T7 may be the operation control and emission control gate electrodes G5 and G6, respectively.

The driving gate electrode G1 is an island type electrode and may be connected to the compensation thin film transistor T3 through the node connection line 1174.

An electrode voltage line HL and the initialization voltage line VL may be arranged over the scan line SL, the previous scan line SL−1, the emission control line EL, and the driving gate electrode G1 with a first interlayer insulating layer IL3 (see FIG. 7A) including an inorganic material therebetween.

As shown in FIG. 6A, the electrode voltage line HL may extend in the x-direction so as to intersect the data line DL and the driving voltage line PL. A portion of the electrode voltage line HL may cover at least a portion of the driving gate electrode G1 and constitute the storage capacitor Cst in cooperation with the driving gate electrode G1. For example, the driving gate electrode G1 may serve as the first storage capacitor plate Cst1 (or a bottom electrode) of the storage capacitor Cst, and a portion of the electrode voltage line HL may serve as the second storage capacitor plate Cst2 (or a top electrode) of the storage capacitor Cst.

The second storage capacitor plate Cst2, which is a portion of the electrode voltage line HL, is electrically connected to the driving voltage line PL. It is shown in FIG. 6A that the electrode voltage line HL is connected to the driving voltage line PL arranged on the electrode voltage line HL through a contact hole 1158. The electrode voltage line HL may have the same voltage level (a constant voltage, e.g. +5V) as that of the driving voltage line PL. The electrode voltage line HL is a kind of a driving voltage line in a transverse direction (x-direction).

Because the driving voltage line PL extends in the y-direction and the electrode voltage line HL electrically connected to the driving voltage line PL extends in the x-direction intersecting the y-direction, a plurality of driving voltage lines PL and electrode voltage lines HL may constitute a mesh structure in the display area DA.

The initialization voltage line VL may extend in the x-direction. The initialization voltage line VL may be connected to the first and second initialization thin film transistors T4 and T7 through an initialization connection line 1173. The initialization voltage line VL may be arranged on the first interlayer insulating layer IL3. For example, the initialization voltage line VL may be arranged on the same layer (e.g. the first interlayer insulating layer IL3) as a layer on which the electrode voltage line HL and/or the second storage capacitor plate Cst2, which is the top electrode of the storage capacitor Cst, is arranged and may include the same material as that of the second storage capacitor plate Cst2.

The electrode voltage line HL and the initialization voltage line VL may include metal such as Mo, Al, Cu, and Ti, and an alloy thereof.

The data line DL, the driving voltage line PL, the initialization connection line 1173, the node connection line 1174, and a first connection metal 1175 may be arranged over the second storage capacitor plate Cst2 and the electrode voltage line HL with a second interlayer insulating layer IL4 (see FIG. 7A) including an inorganic material therebetween. Because the data line DL, the driving voltage line PL, the initialization connection line 1173, the node connection line 1174, and the first connection metal 1175 are formed during the same process, they may include the same material. The data line DL, the driving voltage line PL, the initialization connection line 1173, the node connection line 1174, and the first connection metal 1175 may include a single layer or a multi-layer including at least one of Al, Cu, Ti, etc. According to some example embodiments, the driving voltage line PL and the data line DL may have a multi-layered structure of Ti/Al/Ti.

The data line DL may extend in the y-direction and be connected to the switching source electrode S2 of the switching thin film transistor T2 through a contact hole 1154. A portion of the data line DL may be the switching source electrode S2 (that is, an electrode layer).

The driving voltage line PL may extend in the y-direction and be connected to the electrode voltage line HL through the contact hole 1158 as described above. Also, the driving voltage line PL may be connected to the operation control thin film transistor T5 through a contact hole 1155. The driving voltage line PL may be connected to the operation control drain electrode D5 through the contact hole 1155.

One end of the initialization connection line 1173 may be connected to the first and second initialization thin film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

A first planarization insulating layer IL5 may be located on the data line DL, the driving voltage line PL, the initialization connection line 1173, the node connection line 1174, and the first connection metal 1175. The first planarization insulating layer IL5 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

As shown in FIGS. 6B and 7B, a second connection metal 1176 may be further arranged on the first planarization insulating layer IL5. The second connection metal 1176 may be arranged on the first planarization insulating layer IL5, and the second connection metal 1176 may be covered by a second planarization insulating layer IL6. The second planarization insulating layer IL6 may include a suitable organic insulating material such as an acryl, benzocyclobutene (BCB), polyimide, or hexamethyldisiloxane (HMDSO). The second connection metal 1176 may include a single layer or a multi-layer including at least one of Al, Cu, Ti, etc. The second connection metal 1176, the driving voltage line PL, and the data line DL may include a multi-layered structure of Ti/Al/Ti.

The first connection metal 1175 may be connected to the drain region of the emission control thin film transistor T6 through a contact hole 1153. The first connection metal 1175 may be the drain electrode D6 of the emission control thin film transistor T6. The second connection metal 1176 may be connected to the first connection metal 1175 through a contact hole formed in the first planarization insulating layer IL5, and the pixel electrode 210 may be electrically connected to the second connection metal 1176 through a contact hole CH defined in the second planarization insulating layer IL6. As shown in FIGS. 6A and 7A, in the case where the second connection metal 1176 and the second planarization insulating layer IL6 are omitted, the pixel electrode 210 may be electrically connected to the first connection metal 1175 through a contact hole CH defined in the first planarization insulating layer IL5.

The pixel electrode 210 may include a reflective layer including, for example, silver (Ag), magnesium (Mg), aluminum (Al), platinum (Pt), palladium (Pd), gold (Au), nickel (Ni), neodymium (Nd), iridium (Ir), chrome (Cr), or a compound thereof. According to some example embodiments, the pixel electrode 210 may further include a layer including indium tin oxide (ITO), indium zinc oxide (IZO), zinc oxide (ZnO), or indium oxide ($In_2O_3$) on/under the reflective layer.

A pixel-defining layer PDL may be arranged on the pixel electrode 210, the pixel-defining layer PDL covering edges of the pixel electrode 210. The pixel-defining layer PDL may include an opening exposing a portion of the pixel electrode 210. An intermediate layer 220 may overlap the opening.

The intermediate layer 220 includes an emission layer 222 on the portion of the pixel electrode 210 that is exposed through the opening of the pixel-defining layer PDL. The emission layer 222 may include a polymer organic material or a low molecular weight organic material emitting light of a color (e.g., a set or predetermined color). According to some example embodiments, as shown in FIG. 7A, the intermediate layer 220 may include a first functional layer 221 under the emission layer 222 and/or a second functional layer 223 on the emission layer 222.

The first functional layer 221 may include a single layer or a multi-layer. For example, in the case where the first functional layer 221 includes a polymer material, the first functional layer 221 may be a hole transport layer (HTL), which has a single-layered structure. The first functional layer 221 may include poly-(3, 4)-ethylene-dihydroxy thiophene (PEDOT) or polyaniline (PANI). In the case where the first functional layer 221 includes a low molecular weight material, the first functional layer 221 may include a hole injection layer (HIL) and a hole transport layer (HTL).

The second functional layer 223 may be omitted. For example, in the case where the first functional layer 221 and the emission layer 222 include a polymer material, the second functional layer 223 may be formed to make a characteristic of the organic light-emitting diode OLED excellent. The second functional layer 223 may include a single layer or a multi-layer. The second functional layer 223 may include an electron transport layer (ETL) and/or an electron injection layer (EIL).

An opposite electrode 230 faces the pixel electrode 210 with the intermediate layer 220 therebetween. The opposite electrode 230 may include a conductive material having a low work function. For example, the opposite electrode 230 may include a (semi) transparent layer including Ag, Mg, Al, Pt, Pd, Au, Ni, Nd, Ir, Cr, lithium (Li), calcium (Ca), or an alloy thereof. Alternatively, the opposite electrode 230 may further include a layer including ITO, IZO, ZnO, or $In_2O_3$ on/under the (semi) transparent layer including the above material.

According to some example embodiments, the display layer 200 arranged on the substrate 100 may be covered by the encapsulation member described above with reference to FIGS. 3A to 3C.

Figure 8A:
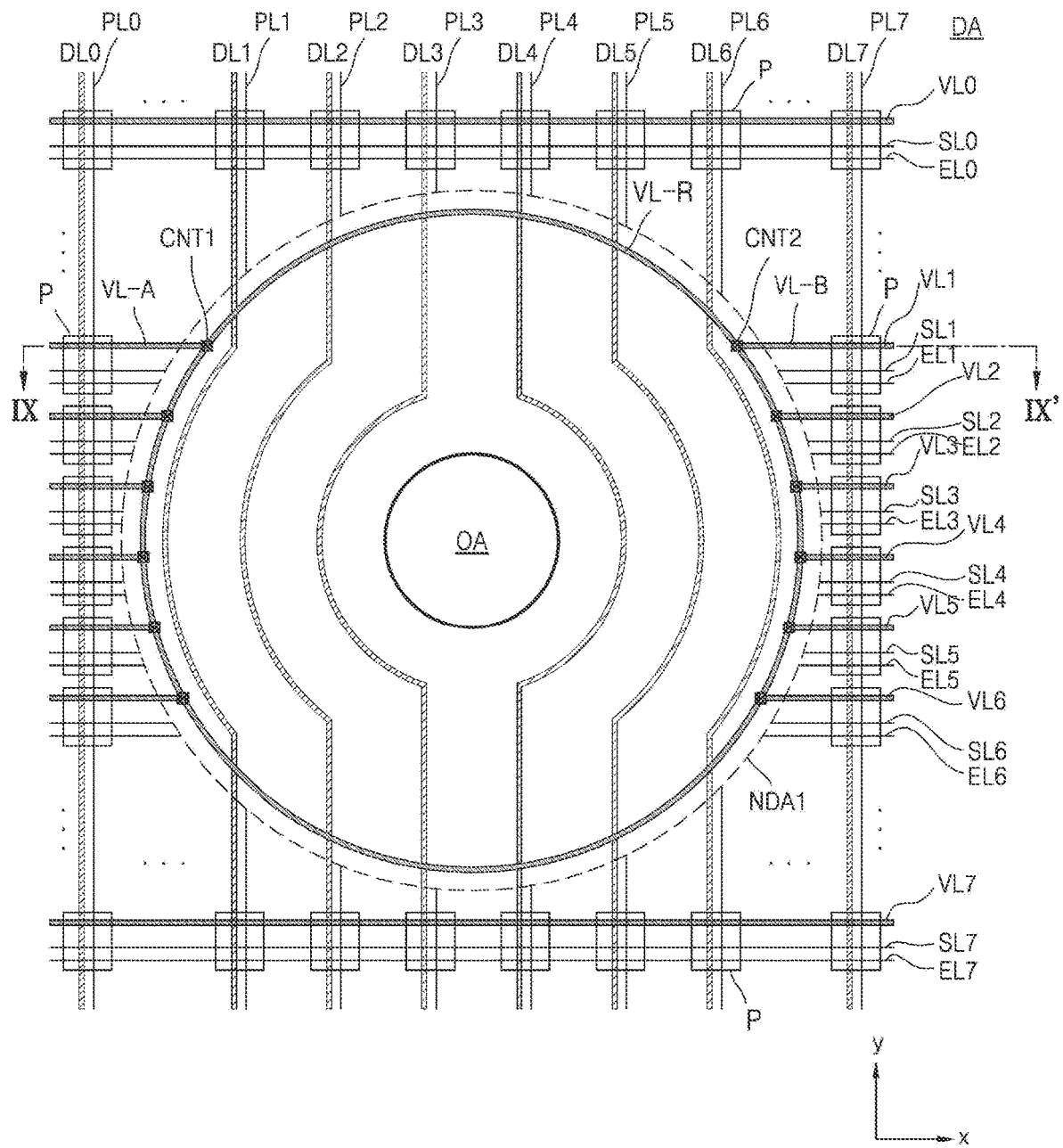
FIGS. 8A and 8B are plan views of wiring lines around a component area according to some example embodiments.
Figure 8B:
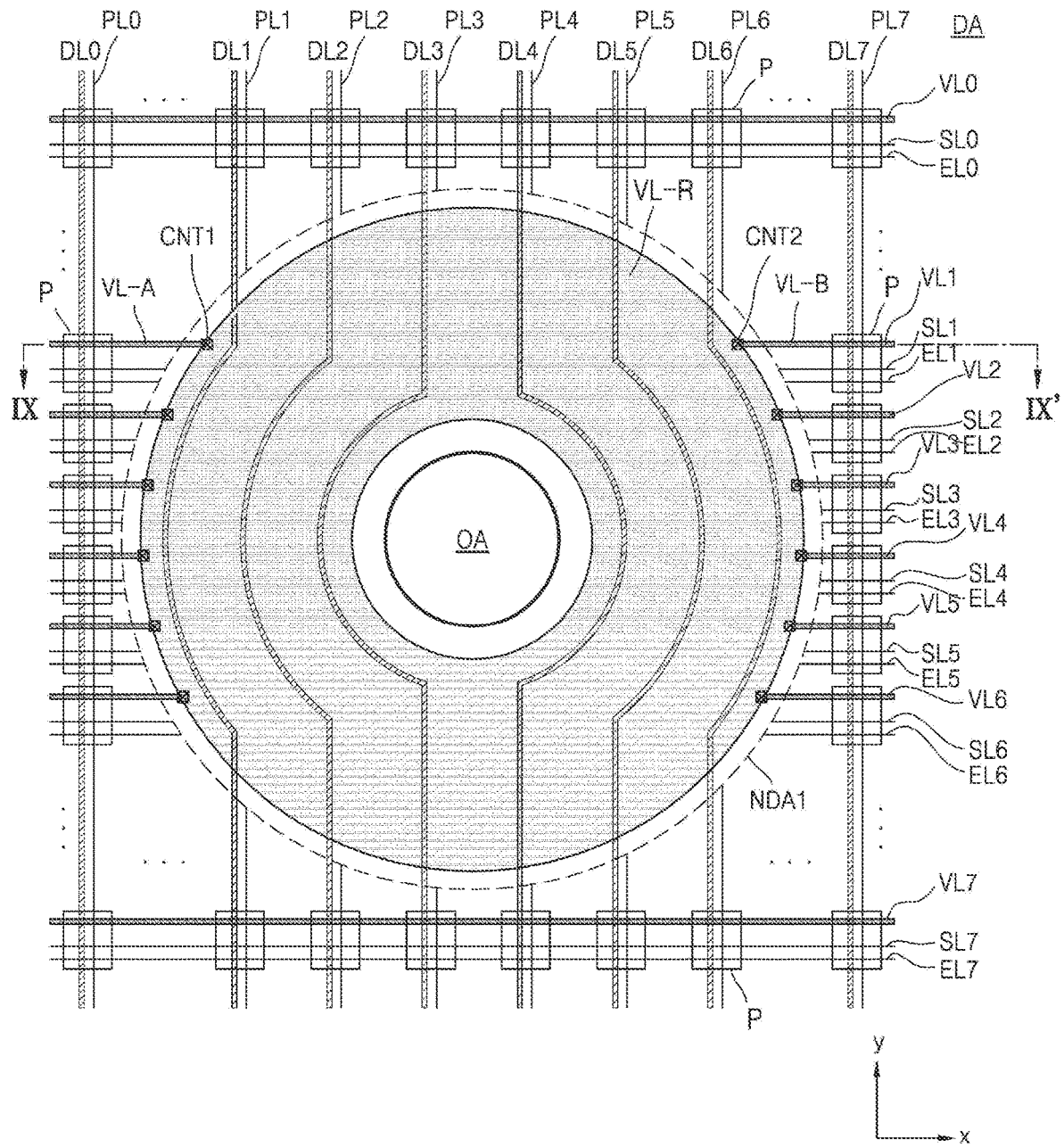
Figure 9A:
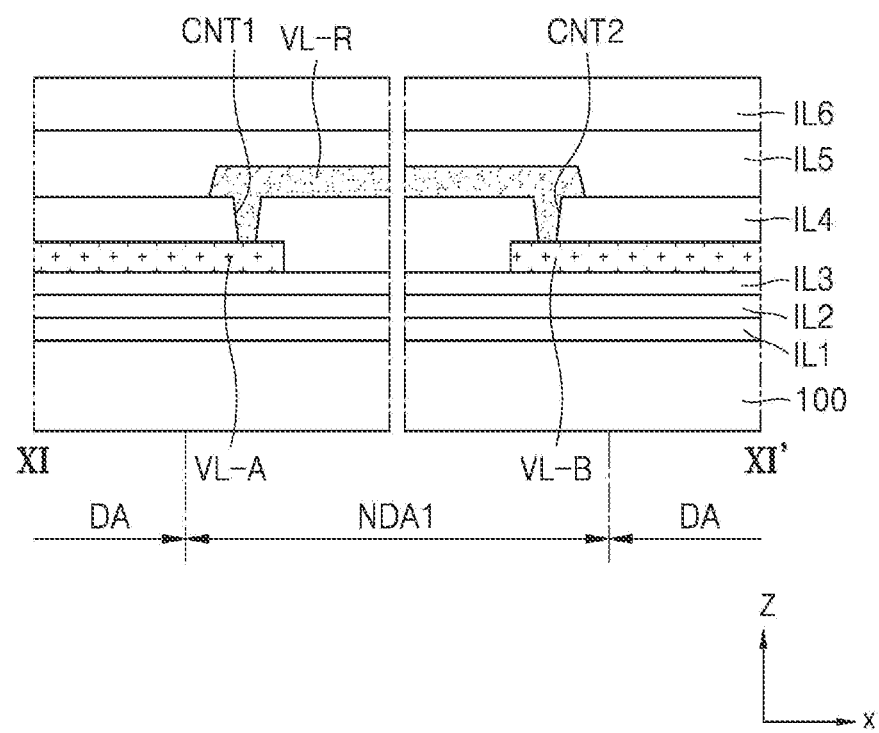
FIGS. 9A and 9B are cross-sectional views of the wiring lines taken along the line IX-IX' of FIGS. 8A and 8B.
Figure 9B:
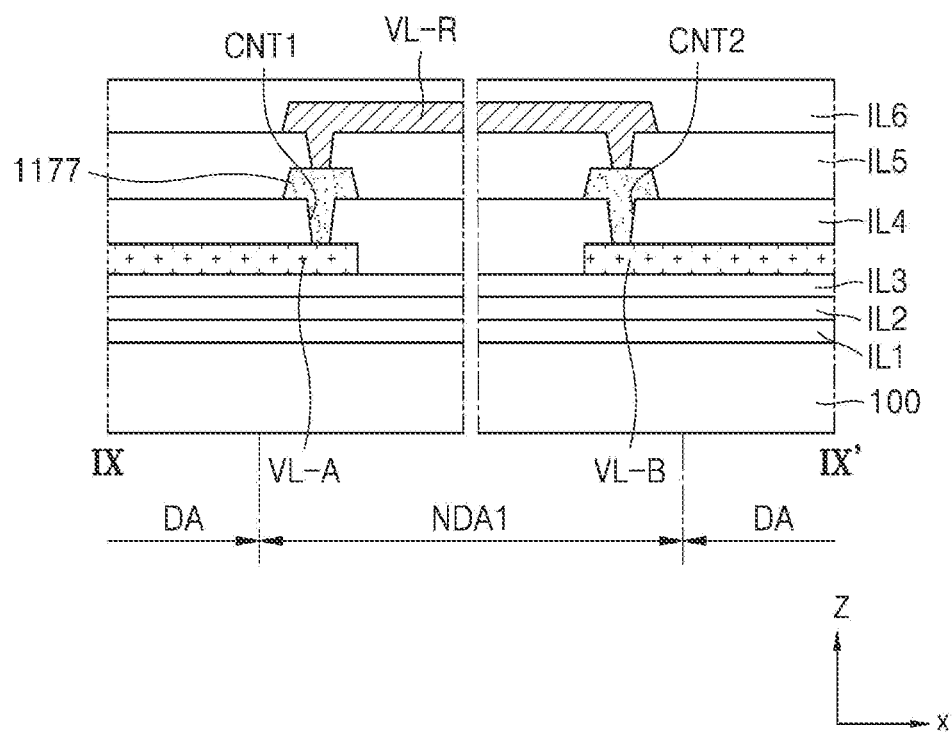

FIGS. 8A and 8B are plan views of wiring lines around the component area OA according to embodiments. FIGS. 9A and 9B are cross-sectional views of the wiring lines taken along the line IX-IX' of FIGS. 8A and 8B. FIGS. 8A and 8B show, for convenience of description, eight data lines DL0, DL1, DL2, DL3, DL4, DL5, DL6, and DL7, eight driving voltage lines PL0, PL1, PL2, PL3, PL4, PL5, PL6, and PL7, eight scan lines SL0, SL1, SL2, SL3, SL4, SL5, SL6, and SL7, eight emission control lines EL0, EL1, EL2, EL3, EL4, EL5, EL6, and EL7, and eight initialization voltage lines VL0, VL1, VL2, VL3, VL4, VL5, VL6, and VL7 around the component area OA.

Referring to FIG. 8A, the data lines DL0, DL1, DL2, DL3, DL4, DL5, DL6, and DL7 and the driving voltage lines PL0, PL1, PL2, PL3, PL4, PL5, PL6, and PL7 may extend in the y-direction.

Some driving voltage lines PL0 and PL7 among the driving voltage lines PL0, PL1, PL2, PL3, PL4, PL5, PL6, and PL7 may continuously extend so as to pass across the display area DA, but other driving voltage lines PL1, PL2, PL3, PL4, PL5, and PL6 around the component area OA may be disconnected or separated around the component area OA. Driving voltage lines, which are located above the component area OA, of the driving voltage lines PL1, PL2, PL3, PL4, PL5, and PL6 that are disconnected may be connected to the second sub-line 163 described above with reference to FIGS. 4A and 4B, and driving voltage lines, which are located below the component area OA, of the driving voltage lines PL1, PL2, PL3, PL4, PL5, and PL6 that are disconnected may be connected to the first sub-line 162.

Some data lines DL1, DL2, DL3, DL4, DL5, and DL6 among the data lines DL0, DL1, DL2, DL3, DL4, DL5, DL6, and DL7 may detour an edge of the component area OA around the component area OA. For example, each of the first to sixth data lines DL1, DL2, DL3, DL4, DL5, and DL6 connecting pixels P arranged below and above the component area OA in FIG. 8A may include a portion extending in the y-direction in the display area DA, and a portion detouring the edge of the component area OA in the first non-display area NDA1.

Though it is shown in FIG. 8A that a detouring portion of each of the data lines DL1, DL2, DL3, DL4, DL5, and DL6 is a curve of an arc, the detouring portion may have a stepwise configuration.

In FIG. 8A, pixels P located above and below the component area OA may be electrically connected to one of the data lines DL1, DL2, DL3, DL4, DL5, and DL6 that detour the component area OA and may receive a data signal from the data lines DL1, DL2, DL3, DL4, DL5, and DL6. For example, the first to third data lines DL1, DL2, and DL3 among the data lines DL1, DL2, DL3, DL4, DL5, and DL6 may be bent along a left edge of the component area OA, and the fourth to sixth data lines DL4, DL5, and DL6 may be bent along a right edge of the component area OA. Though it is shown in FIG. 8A, for convenience of description, that three detouring data lines DL1, DL2, and DL3 (DL4, DL5, and DL6) are arranged on the left and the right around the component area OA, the number of data lines detouring the component area OA may be three or more.

The scan lines SL0, SL1, SL2, SL3, SL4, SL5, SL6, and SL7 and the emission control lines EL0, EL1, EL2, EL3, EL4, EL5, EL6, and EL7 may extend in the x-direction intersecting the y-direction. Some of the scan lines SL0, SL1, SL2, SL3, SL4, SL5, SL6, and SL7, and the emission control lines EL0, EL1, EL2, EL3, EL4, EL5, EL6, and EL7, for example, the first to sixth scan lines SL1, SL2, SL3, SL4, SL5, and SL6 and the first to sixth emission control lines EL1, EL2, EL3, EL4, EL5, and EL6 may be disconnected around the component area OA. As described above with reference to FIGS. 4A and 4B, because the first scan driving circuit 110 and the second scan driving circuit 120 are arranged on two opposite sides of the display area DA, some of the disconnected scan lines SL1, SL2, SL3, SL4, SL5, and SL6 and the disconnected emission control lines EL1, EL2, EL3, EL4, EL5, and EL6 arranged on the left of the component area OA in the plan view of FIG. 8A may be connected to the first scan driving circuit 110. In the plan view of FIG. 8A, some of the disconnected scan lines SL1, SL2, SL3, SL4, SL5, and SL6 and the disconnected emission control lines EL1, EL2, EL3, EL4, EL5, and EL6 arranged on the right of the component area OA may be connected to the second scan driving circuit 120.

The initialization voltage lines VL0, VL1, VL2, VL3, VL4, VL5, VL6, and VL7 may extend in the x-direction. Some initialization voltage lines VL1, VL2, VL3, VL4, VL5, and VL6 around the component area OA may be disconnected around the component area OA. In the plan view of FIG. 8A, a first initialization voltage line VL-A located on the left of the component area OA may be apart from a second initialization voltage line VL-B located on the right of the component area OA with the component area OA therebetween.

The first initialization voltage line VL-A and the second initialization voltage line VL-B that are apart from each other may be respectively connected to the first initialization power supply line 181 and the second initialization power supply line 182 described above with reference to FIGS. 4A and 4B. For example, in the case where the first initialization voltage line VL-A and the second initialization voltage line VL-B are apart from each other around the component area OA, a difference between an initialization voltage applied to pixels P arranged around the component area OA and an initialization voltage applied to other pixels P may occur. In this case, quality of an image displayed by the pixels P may be deteriorated.

In contrast, according to some example embodiments, because the first initialization voltage line VL-A and the second initialization voltage line VL-B are connected to an auxiliary voltage line VL-R, the above issue may be prevented or minimized.

The auxiliary voltage line VL-R may have a ring shape extending along a circumferential direction of the component area OA. According to some example embodiments, as shown in FIG. 8A, the auxiliary voltage line VL-R may have a linear structure neighboring a boundary between the third area and the second area and arranged in the second area. According to some example embodiments, as shown in FIG. 8B, the auxiliary voltage line VL-R may have a plate-type structure covering approximately the entire third area of the substrate 100. The auxiliary voltage line VL-R may be arranged on a layer different from a layer on which the initialization voltage lines VL0, VL1, VL2, VL3, VL4, VL5, VL6, and VL7 are arranged and may electrically connect the initialization voltage lines that are apart from each other around the component area OA through first and second contact holes CNT1 and CNT2.

For example, the first initialization voltage line VL-A may be connected to the auxiliary voltage line VL-R through the first contact hole CNT1, and the second initialization voltage line VL-B may be connected to the auxiliary voltage line VL-R through the second contact hole CNT2. As described with reference to FIG. 6A, the initialization voltage lines VL0, VL1, VL2, VL3, VL4, VL5, VL6, and VL7 are arranged on the first interlayer insulating layer IL3. It is shown in FIGS. 9A and 9B that the first initialization voltage line VL-A and the second initialization voltage line VL-B that are apart from each other around the component area OA are arranged on the first interlayer insulating layer IL3.

The auxiliary voltage line VL-R may be arranged over the first initialization voltage line VL-A and the second initialization voltage line VL-B with one or more insulating layers therebetween. For example, as shown in FIG. 9A, the auxiliary voltage line VL-R may be arranged on the second interlayer insulating layer IL4 and may be covered by the first planarization insulating layer IL5 and the second planarization insulating layer IL6 arranged below the pixel electrode 210 (see FIG. 7B). A portion of the auxiliary voltage line VL-R may be connected to the first initialization voltage line VL-A through a first contact hole CNT1 of the second interlayer insulating layer IL4. Similarly, another portion of the auxiliary voltage line VL-R may be connected to the second initialization voltage line VL-B through a second contact hole CNT2 of the second interlayer insulating layer IL4.

According to some example embodiments, as shown in FIG. 9B, the auxiliary voltage line VL-R may be arranged on the first planarization insulating layer IL5 and covered by the second planarization insulating layer IL6 arranged below the pixel electrode 210 (see FIG. 7B). A portion of the auxiliary voltage line VL-R may be connected to a mediation metal layer 1177 through a contact hole of the first planarization insulating layer IL5, and the mediation metal layer 1177 may be connected to the first initialization voltage line VL-A through a first contact hole CNT1 of the second interlayer insulating layer IL4. Similarly, another portion of the auxiliary voltage line VL-R may be connected to the mediation metal layer 1177 through a contact hole of the first planarization insulating layer IL5, and the mediation metal layer 1177 may be connected to the second initialization voltage line VL-B through a second contact hole CNT2 of the second interlayer insulating layer IL4.

Because the initialization voltage lines VL1, VL2, VL3, VL4, VL5, and VL6 that are disconnected are connected as one body by the auxiliary voltage line VL-R, initialization voltage lines and the auxiliary voltage line VL-R each may have the same voltage level. Therefore, the occurrence of a voltage deviation originated from disconnection of the initialization voltage line may be minimized.

Figure 10:
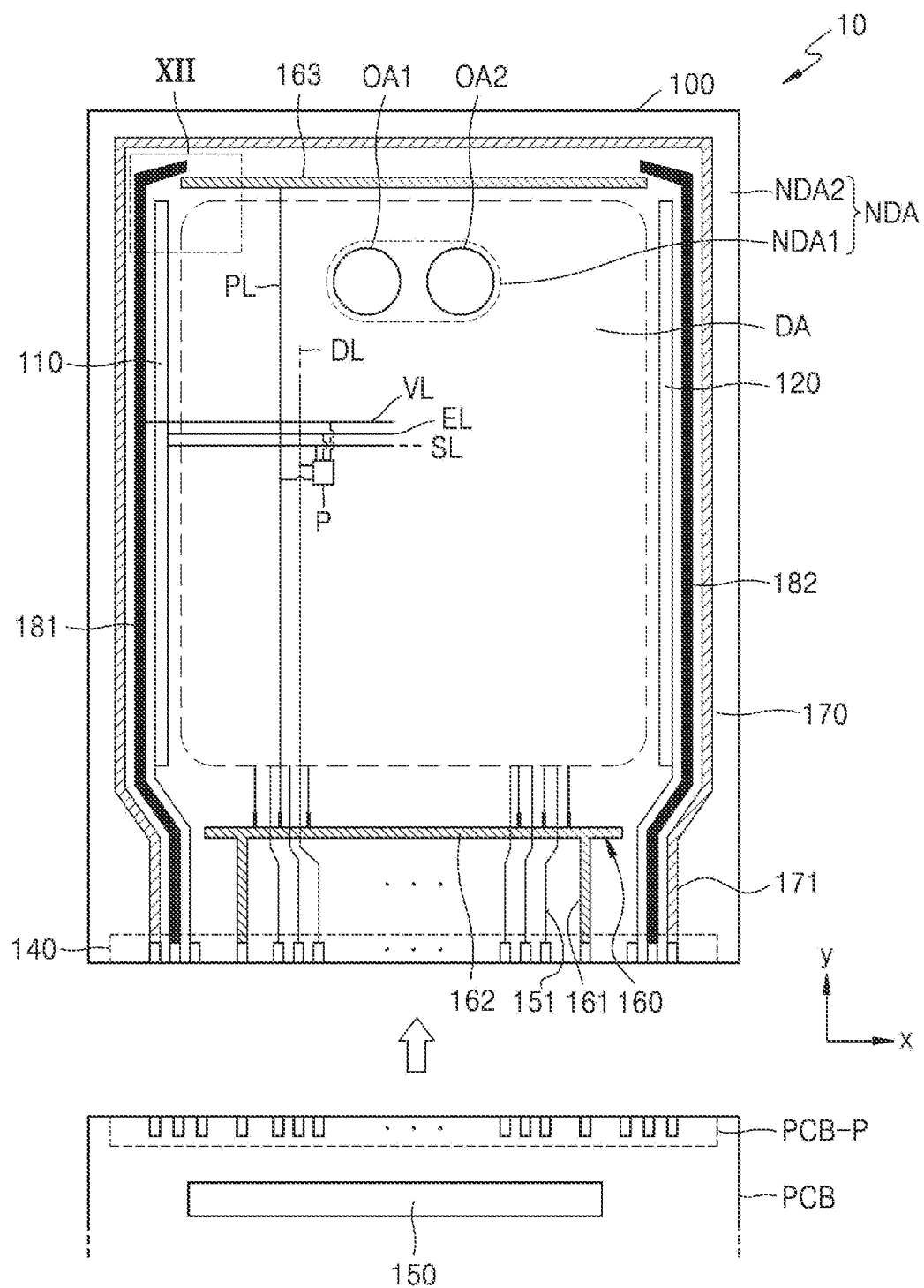
FIG. 10 is a plan view of a display panel according to some example embodiments.

FIG. 10 is a plan view of a display panel according to some example embodiments.

The display panel may include a plurality of component areas OA1 and OA2. According to some example embodiments, it is shown in FIG. 10 that the display panel includes two component areas OA1 and OA2.

The pixels P may be apart from each other around the plurality of component areas OA1 and OA2. Pixels P may not be arranged in a region between the plurality of component areas OA1 and OA2. For example, as shown in FIG. 10, the first non-display area NDA1 may surround the plurality of component areas OA1 and OA2. Because description of other elements of the display panel shown in FIG. 10 are the same as that made with reference to FIGS. 4A and 4B, description thereof is omitted.

Figure 11:
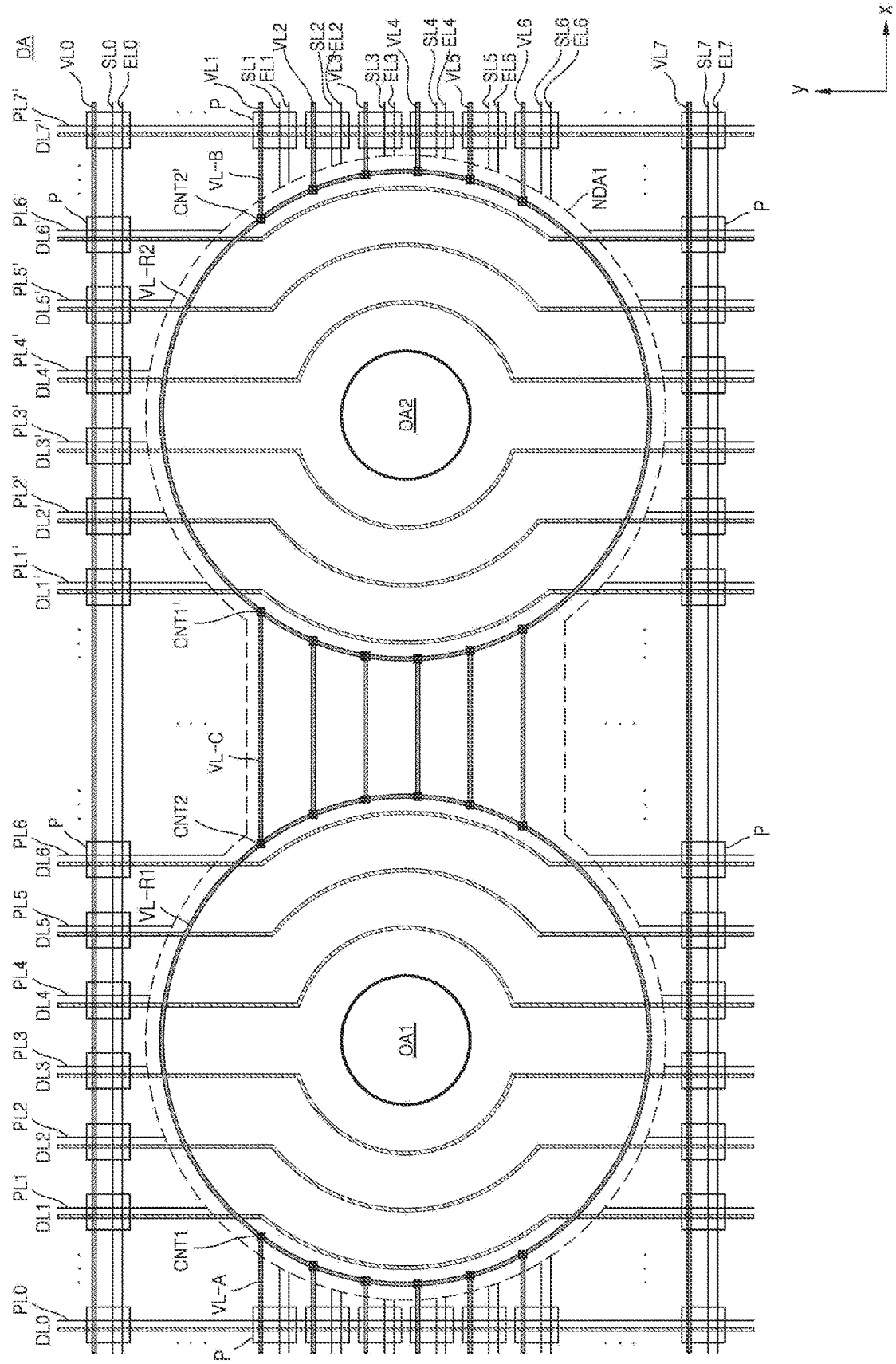
FIG. 11 is a plan view of wiring lines around a plurality of component areas according to some example embodiments.

FIG. 11 is a plan view of wiring lines around a plurality of component areas according to some example embodiments.

Referring to FIG. 11, each of the initialization voltage lines VL1, VL2, VL3, VL4, VL5, and VL6 may include a portion disconnected around the plurality of component areas OA1 and OA2. According to some example embodiments, FIG. 11 shows the first initialization voltage line VL-A on the left of the first component area OA1, the second initialization voltage line VL-B on the right of the second component area OA2, and a third initialization voltage line VL-C between the first component area OA1 and the second component area OA2. The first initialization voltage line VL-A, the second initialization voltage line VL-B, and the third initialization voltage line VL-C may be apart from one another.

The first initialization voltage line VL-A may be connected to the third initialization voltage line VL-C through a first auxiliary voltage line VL-R1. The third initialization voltage line VL-C may be connected to the second initialization voltage line VL-B through a second auxiliary voltage line VL-R2.

Each of the first auxiliary voltage line VL-R1 and the second auxiliary voltage line VL-R2 may be arranged on a layer different from layers on which the first initialization voltage line VL-A, the second initialization voltage line VL-B, and the third initialization voltage line VL-C are arranged. For example, the first auxiliary voltage line VL-R1 may be connected to the first initialization voltage line VL-A through the first contact hole CNT1 and connected to the third initialization voltage line VL-C through the second contact hole CNT2. Likewise, the second auxiliary voltage line VL-R2 may be connected to the third initialization voltage line VL-C through a first contact hole CNT1' and connected to the second initialization voltage line VL-B through a second contact hole CNT2'.

Cross-sections corresponding to the connection between the first auxiliary voltage line VL-R1 and the first initialization voltage line VL-A and the connection between the first auxiliary voltage line VL-R1 and the third initialization voltage line VL-C may have the same structure as that described above with reference to FIGS. 9A and 9B. Likewise, cross-sections corresponding to the connection between the second auxiliary voltage line VL-R2 and the third initialization voltage line VL-C and the connection between the second auxiliary voltage line VL-R2 and the second initialization voltage line VL-B may have the same structure as that described above with reference to FIGS. 9A and 9B.

Figure 12:
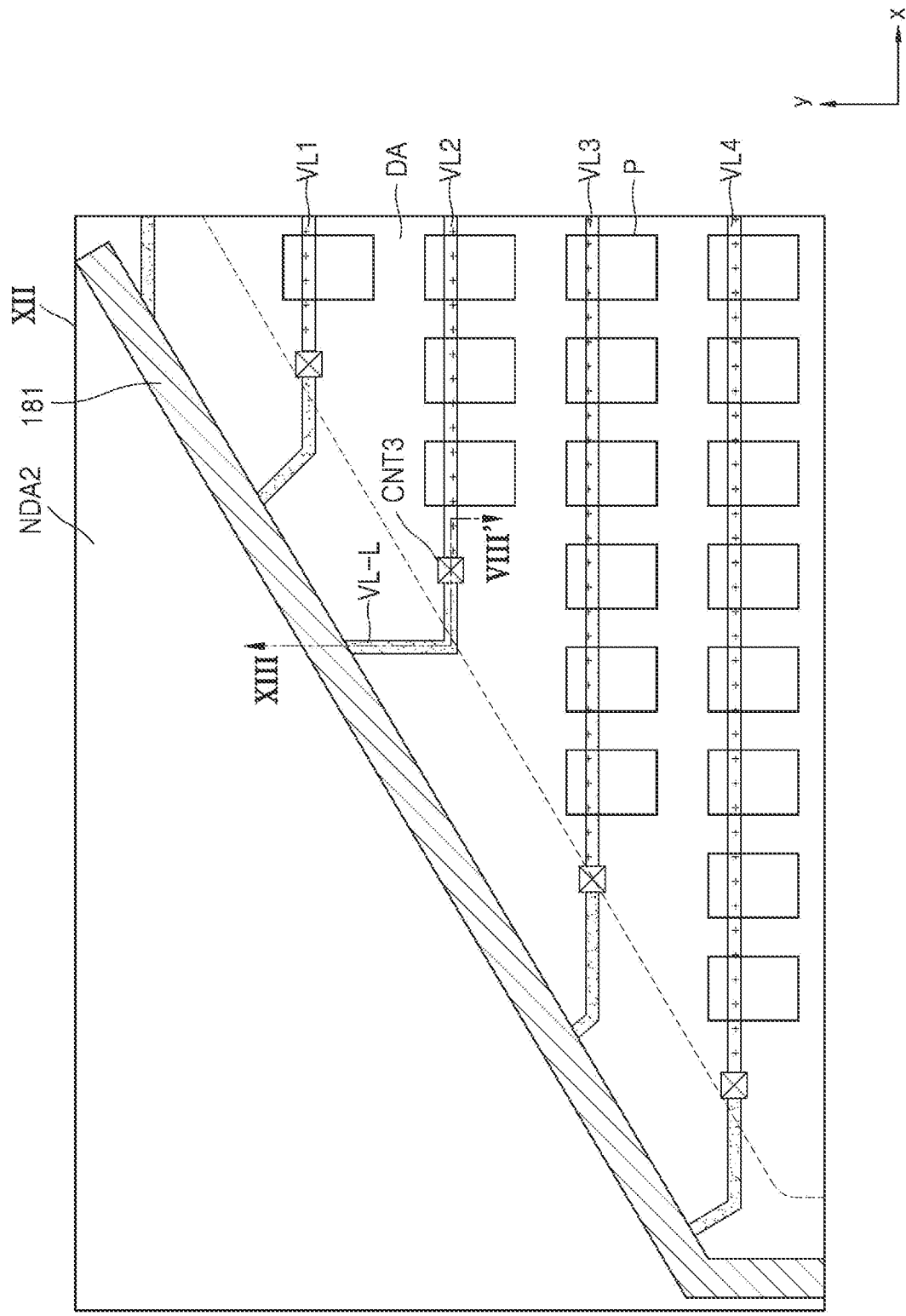
FIG. 12 is a plan view of wiring lines around a second non-display area according to some example embodiments.
Figure 13A:
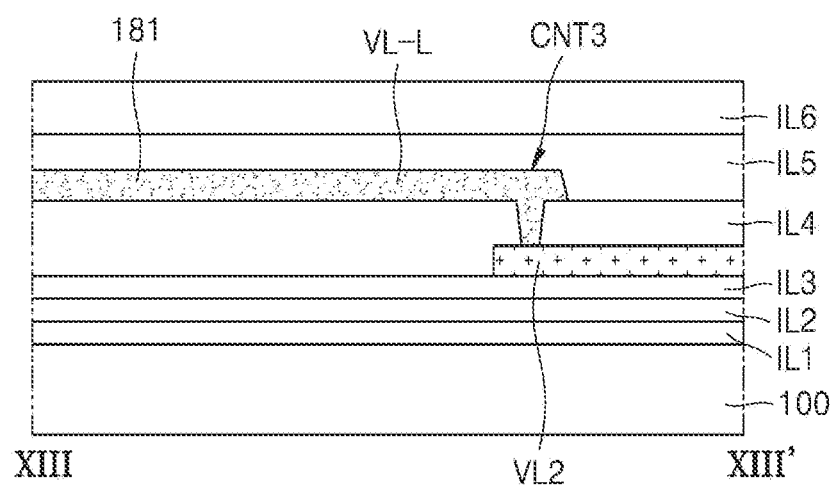
FIGS. 13A and 13B are cross-sectional views of a display device according to some example embodiments.
Figure 13B:
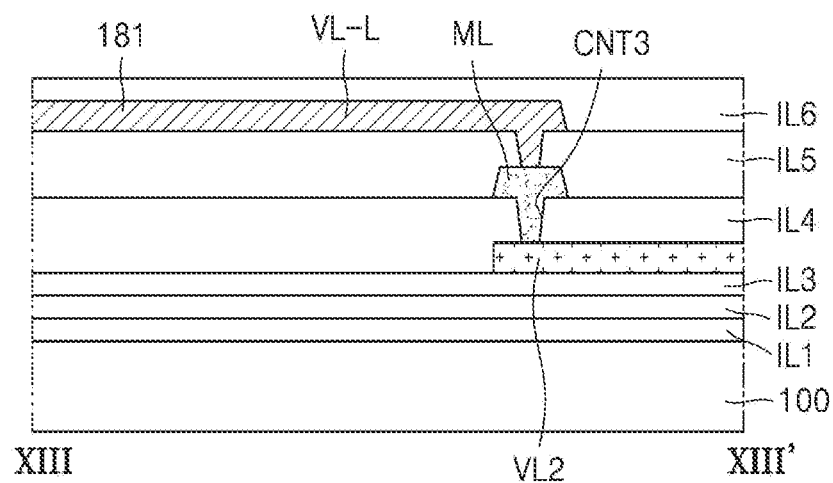

FIG. 12 is a plan view of wiring lines around the second non-display area NDA2 according to some example embodiments and may correspond to a region XII of FIG. 10, and FIGS. 13A and 13B are cross-sectional views of a display device according to embodiments and may correspond to cross-sections taken along the line XIII-XIII' of FIG. 12.

Referring to FIG. 12, the first initialization power supply line 181 may be connected to the plurality of initialization voltage lines VL1, VL2, VL3, and VL4 passing across the display area DA. The first initialization power supply line 181 may include a portion extending in the y-direction and a portion extending in a direction that is oblique with respect to the y-direction. FIG. 12 mainly shows a portion of the first initialization power supply line 181 extending in the oblique direction.

As shown in FIG. 10, a corner of the display area DA may have a rounded structure. When the corner is enlarged, pixels P may be arranged in a stepwise configuration as shown in FIG. 12. To provide the initialization voltage to the pixels P arranged in the stepwise configuration while efficiently utilizing the space of the second non-display area NDA2, a portion of the first initialization power supply line 181 may extend in the oblique direction, for example, a direction between the x-direction and the y-direction as shown in FIG. 12.

The first initialization power supply line 181 may include a plurality of connection lines VL-L extending from one side of the first initialization power supply line 181. Each connection line VL-L may be electrically connected to a corresponding initialization voltage line among the plurality of initialization voltage lines VL1, VL2, VL3, and VL4.

The first initialization power supply line 181 may be arranged on a layer different from layers on which the initialization voltage lines VL1, VL2, VL3, and VL4 are arranged and may be electrically connected to the initialization voltage lines VL1, VL2, VL3, and VL4 through a third contact hole CNT3.

According to some example embodiments, as shown in FIG. 13A, the first initialization power supply line 181 may be arranged on the second interlayer insulating layer IL4. The initialization voltage lines may be arranged on the first interlayer insulating layer IL3. It is shown in FIG. 13A that the second initialization voltage line VL2 among the plurality of initialization voltage lines VL1, VL2, VL3, and VL4 is arranged on the first interlayer insulating layer IL3. The connection line VL-L extending from the first initialization power supply line 181 may be connected to the second initialization voltage line VL2 through a contact hole formed in the second interlayer insulating layer IL4, the contact hole formed in the second interlayer insulating layer IL4 corresponding to the third contact hole CNT3 described with reference to FIG. 12.

The first initialization power supply line 181 arranged on the second interlayer insulating layer IL4 may include the same material as that of the data line and/or the driving voltage line described above with reference to FIGS. 6A and 7A. Also, the first initialization power supply line 181 may include the same material as those of the node connection line 1174 and the first connection metal 1175.

According to some example embodiments, as shown in FIG. 13B, the first initialization power supply line 181 may be arranged on the first planarization insulating layer IL5. The connection line VL-L extending from the first initialization power supply line 181 may be connected to a metal layer ML through a contact hole formed in the first planarization insulating layer IL5, and the metal layer ML may be connected to the initialization voltage line, for example, the second initialization voltage line VL2 through a contact hole formed in the second interlayer insulating layer IL4. The contact hole formed in the first planarization insulating layer IL5 and the contact hole formed in the second interlayer insulating layer IL4 may correspond to the third contact hole CNT3 described with reference to FIG. 12.

The first initialization power supply line 181 arranged on the first planarization insulating layer IL5 may include the same material as that of the second connection metal 1176 described above with reference to FIGS. 6B and 7B.

For example, though FIGS. 12 to 13B mainly describe the first initialization power supply line 181, the structure described with reference to FIGS. 12 to 13B is equally applicable to the second initialization power supply line 182 (see FIG. 10), and equally applicable to the first and second initialization power supply lines described with reference to FIGS. 4A and 4B.

According to some example embodiments, as described above, a display panel having an improved reliability and a reduced non-display area, and a display device including the display panel may be provided.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device including at least one component area inside a display area, the at least one component area including a first component area and a second component area adjacent each other, the display device comprising:
    a plurality of display elements in the display area, the plurality of display elements comprising a first display element disposed around the first component area and a second display element disposed around the second component area;
    a first initialization voltage line electrically connected to the first display element and extending in a first direction in the display area;
    a second initialization voltage line electrically connected to the second display element and extending in the first direction in the display area, and being apart from the first initialization voltage line with the first component area and the second component area therebetween;
    a third initialization voltage line extending in the first direction between the first component area and the second component area; and
    a first auxiliary voltage line electrically connected to the first initialization voltage line and the third initialization voltage line; and
    a second auxiliary voltage line electrically connected to the second initialization voltage line and the third initialization voltage line,
    wherein the first initialization voltage line and the first auxiliary voltage line are disposed on different layers.

2. The display device of claim 1, wherein the first auxiliary voltage line surrounds the first component area and the second auxiliary voltage line surrounds the second component area.

3. The display device of claim 1, wherein the first initialization voltage line and the second initialization voltage line are arranged on a same layer.

4. The display device of claim 3, wherein the first initialization voltage line and the third initialization voltage line are arranged on a same layer.

5. The display device of claim 1, further comprising a mediation metal layer between the first initialization voltage line and the first auxiliary voltage line, and between the second initialization voltage line and the second auxiliary voltage line.

6. The display device of claim 1, further comprising:
    a first scan line extending in the first direction and electrically connected to the first display element; and
    a second scan line extending in the first direction and electrically connected to the second display element,
    wherein the first scan line is apart from the second scan line with the at least one component area therebetween.

7. The display device of claim 1, wherein the first auxiliary voltage line and the second auxiliary voltage line are disposed in a first non-display area between the display area and the first component area and between the display area and the second component area.

8. The display device of claim 7, further comprising an initialization power supply line in a second non-display area surrounding the display area and electrically connected to the first initialization voltage line.

9. The display device of claim 8, further comprising:
    a first data line extending in a second direction intersecting the first direction and connected to the first display element; and
    a second data line extending in the second direction and connected to the second display element,
    wherein the initialization power supply line includes a same material as that of the first data line or the second data line.

10. The display device of claim 1, further comprising:
    a first emission control line extending in the first direction and electrically connected to the first display element; and
    a second emission control line extending in the first direction and electrically connected to the second display element,
    wherein the first emission control line is apart from the second emission control line with the at least one component area therebetween.

11. The display device of claim 1, further comprising thin film transistors and a storage capacitor, the thin film transistors being electrically connected to the first display element, and the storage capacitor including a bottom electrode and a top electrode,
    wherein the first initialization voltage line and the second initialization voltage line include a same material as that of the top electrode of the storage capacitor.

12. The display device of claim 11, further comprising a contact metal connecting one of the thin film transistors to the first display element,
    wherein the first auxiliary voltage line includes a same material as that of the contact metal.

13. The display device of claim 1, wherein each of the plurality of display elements includes a pixel electrode, an opposite electrode above the pixel electrode, and an emission layer between the pixel electrode and the opposite electrode.

14. The display device of claim 13, further comprising a first insulating layer between the first auxiliary voltage line and the pixel electrode.

15. The display device of claim 14, further comprising: a second insulating layer between the first and second initialization voltage lines and the first and second auxiliary voltage lines.

* * * * *